(12) United States Patent
Park et al.

(10) Patent No.: US 12,355,005 B2
(45) Date of Patent: Jul. 8, 2025

(54) SEMICONDUCTOR PACKAGE AND METHOD OF FABRICATING THE SAME

(71) Applicant: Samsung Electronics Co., Ltd., Suwon-si (KR)

(72) Inventors: Jongho Park, Cheonan-si (KR); Un-Byoung Kang, Hwaseong-si (KR); Sechul Park, Bucheon-si (KR); Hyojin Yun, Suwon-si (KR); Ju-Il Choi, Seongnam-si (KR); Atsushi Fujisaki, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 17/700,879

(22) Filed: Mar. 22, 2022

(65) Prior Publication Data

US 2023/0046782 A1 Feb. 16, 2023

(30) Foreign Application Priority Data

Aug. 10, 2021 (KR) .................. 10-2021-0105292

(51) Int. Cl.
*H01L 25/065* (2023.01)
*H01L 21/02* (2006.01)
(Continued)

(52) U.S. Cl.
CPC .... *H01L 25/0657* (2013.01); *H01L 21/02057* (2013.01); *H01L 21/563* (2013.01);
(Continued)

(58) Field of Classification Search
CPC .......... H01L 25/0657; H01L 21/02057; H01L 21/563; H01L 21/565; H01L 25/50;
(Continued)

(56) References Cited

U.S. PATENT DOCUMENTS

| 5,244,839 A | * | 9/1993 | Baker | H01L 21/31051 |
| | | | | 257/E21.243 |
| 5,344,839 A | * | 9/1994 | Bartroli | A01N 43/80 |
| | | | | 514/312 |

(Continued)

FOREIGN PATENT DOCUMENTS

| JP | 5509170 B2 | 3/2014 |
| JP | 5803803 B2 | 9/2015 |
| JP | 2015225933 A | 12/2015 |

*Primary Examiner* — Nicholas J Tobergte
*Assistant Examiner* — Jeremy Alexander Rine
(74) *Attorney, Agent, or Firm* — Myers Bigel, P.A.

(57) ABSTRACT

Disclosed are semiconductor packages and their fabrication methods. The semiconductor package comprises a substrate that includes a plurality of vias, a first chip stack on the substrate and including a plurality of first semiconductor chips that are sequentially stacked on the substrate, and a plurality of first non-conductive layers between the substrate and the first chip stack and between neighboring first semiconductor chips. Each of the first non-conductive layers includes first extensions that protrude outwardly from first lateral surfaces of the first semiconductor chips. The more remote the first non-conductive layers are from the substrate, the first extensions protrude a shorter length from the first lateral surfaces of the first semiconductor chips.

19 Claims, 20 Drawing Sheets

(51) Int. Cl.
   *H01L 21/56*      (2006.01)
   *H01L 25/00*      (2006.01)
(52) U.S. Cl.
   CPC ............ H01L 21/565 (2013.01); H01L 25/50 (2013.01); *H01L 2225/06513* (2013.01); *H01L 2225/06541* (2013.01); *H01L 2225/06565* (2013.01); *H01L 2225/06582* (2013.01)
(58) Field of Classification Search
   CPC . H01L 2225/06513; H01L 2225/06541; H01L 2225/06565; H01L 2225/06582
   See application file for complete search history.

(56) References Cited

U.S. PATENT DOCUMENTS

| | | | |
|---|---|---|---|
| 7,883,991 | B1 | 2/2011 | Wu et al. |
| 7,919,356 | B2 | 4/2011 | Farooq et al. |
| 8,928,132 | B2 | 1/2015 | Choi et al. |
| 9,698,072 | B2 | 7/2017 | Brofman et al. |
| 2007/0007639 | A1* | 1/2007 | Fukazawa ............ H01L 25/0657 438/109 |
| 2008/0105984 | A1* | 5/2008 | Lee ................... H01L 24/73 257/E25.023 |
| 2010/0140811 | A1* | 6/2010 | Leal ................... H01L 24/76 257/E23.141 |
| 2014/0295620 | A1* | 10/2014 | Ito ..................... H01L 25/0657 438/108 |
| 2017/0162544 | A1* | 6/2017 | Kwak ............... H01L 23/49827 |
| 2017/0243857 | A1* | 8/2017 | Hwang ............... H01L 24/17 |
| 2021/0183806 | A1* | 6/2021 | Bayless ............. H01L 23/3121 |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0105292 filed on Aug. 10, 2021 in the Korean Intellectual Property Office, the disclosure of which is hereby incorporated by reference in its entirety.

FIELD

The present inventive concepts relate to a semiconductor package and a method of fabricating the same and, more particularly, to a stacked semiconductor package in which a plurality of semiconductor chips are stacked on a substrate and a method of fabricating the same.

BACKGROUND

With the development of the electronic industry, electronic products have increased demand for high performance, high speed, and compact size. To meet the trend, there has recently been developed a packaging technology in which a plurality of semiconductor chips are mounted in a single package.

Portable devices have been in increased demand in recent electronic product markets, and as a result, there has been a ceaseless requirement for reduction in size and weight of electronic parts mounted on the portable devices. In order to accomplish the reduction in size and weight of the electronic parts, there is need for technology to integrate a number of individual devices into a single package as well as technology to reduce individual sizes of mounting parts. A large number of adhesive members are used to attach a plurality of devices to each other, and various problems occur due to an increase in the number of the adhesive members.

SUMMARY

Some embodiments of the present inventive concepts provide a semiconductor package with improved structural stability and a method of fabricating the same.

Some embodiments of the present inventive concepts provide a method of fabricating a semiconductor package with reduced occurrence of failure and a semiconductor package fabricated by the same.

According to some embodiments of the present inventive concepts, a semiconductor package may include a substrate that includes a plurality of vias, a first chip stack on the substrate, the first chip stack including a plurality of first semiconductor chips that are sequentially stacked on the substrate, and a plurality of first non-conductive layers between the substrate and the first chip stack and between neighboring first semiconductor chips. Each of the first non-conductive layers may include first extensions that protrude outwardly from first lateral surfaces of the first semiconductor chips. The more remote the first non-conductive layers are from the substrate, the first extensions protrude a shorter length from the first lateral surfaces of the first semiconductor chips.

According to some embodiments of the present inventive concepts, a method of fabricating a semiconductor package may include providing a semiconductor wafer, providing a first non-conductive layer on the semiconductor wafer, providing a first semiconductor chip on the first non-conductive layer to mount the first semiconductor chip on the semiconductor wafer, providing a second non-conductive layer on the first semiconductor chip, providing a second semiconductor chip on the second non-conductive layer to mount the second semiconductor chip on the first semiconductor chip, performing a strip process on the semiconductor wafer, and forming on the semiconductor wafer a molding layer that covers the first semiconductor chip and the second semiconductor chip. When the first semiconductor chip is mounted on the semiconductor wafer, the first non-conductive layer may protrude onto a lateral surface of the first semiconductor chip to form a first extension. When the second semiconductor chip is mounted on the first semiconductor chip, the second non-conductive layer may protrude onto a lateral surface of the second semiconductor chip to form a second extension. The strip process may remove a portion of the first extension and a portion of the second extension. In the strip process, a first etch rate of the first extension may be less than a second etch rate of the second extension.

According to some embodiments of the present inventive concepts, a semiconductor package may include a substrate that includes a plurality of vias, a first semiconductor chip mounted on a first chip terminal on the substrate, a first non-conductive layer that fills a space between the substrate and the first semiconductor chip, a second semiconductor chip mounted on a second chip terminal on a top surface of the first semiconductor chip, a second non-conductive layer that fills a space between the first semiconductor chip and the second semiconductor chip, and a molding layer on the substrate, the molding layer surrounding the first semiconductor chip and the second semiconductor chip. A first width of the first non-conductive layer between the substrate and the first semiconductor chip may be greater than a second width of the second non-conductive layer between the first semiconductor chip and the second semiconductor chip. The first non-conductive layer and the second non-conductive layer may include the same material. A first rigidity of the first non-conductive layer may be greater than a second rigidity of the second non-conductive layer.

DETAILED DESCRIPTION

The following will now describe a semiconductor package according to the present inventive concepts with reference to the accompanying drawings.

Figure 1:
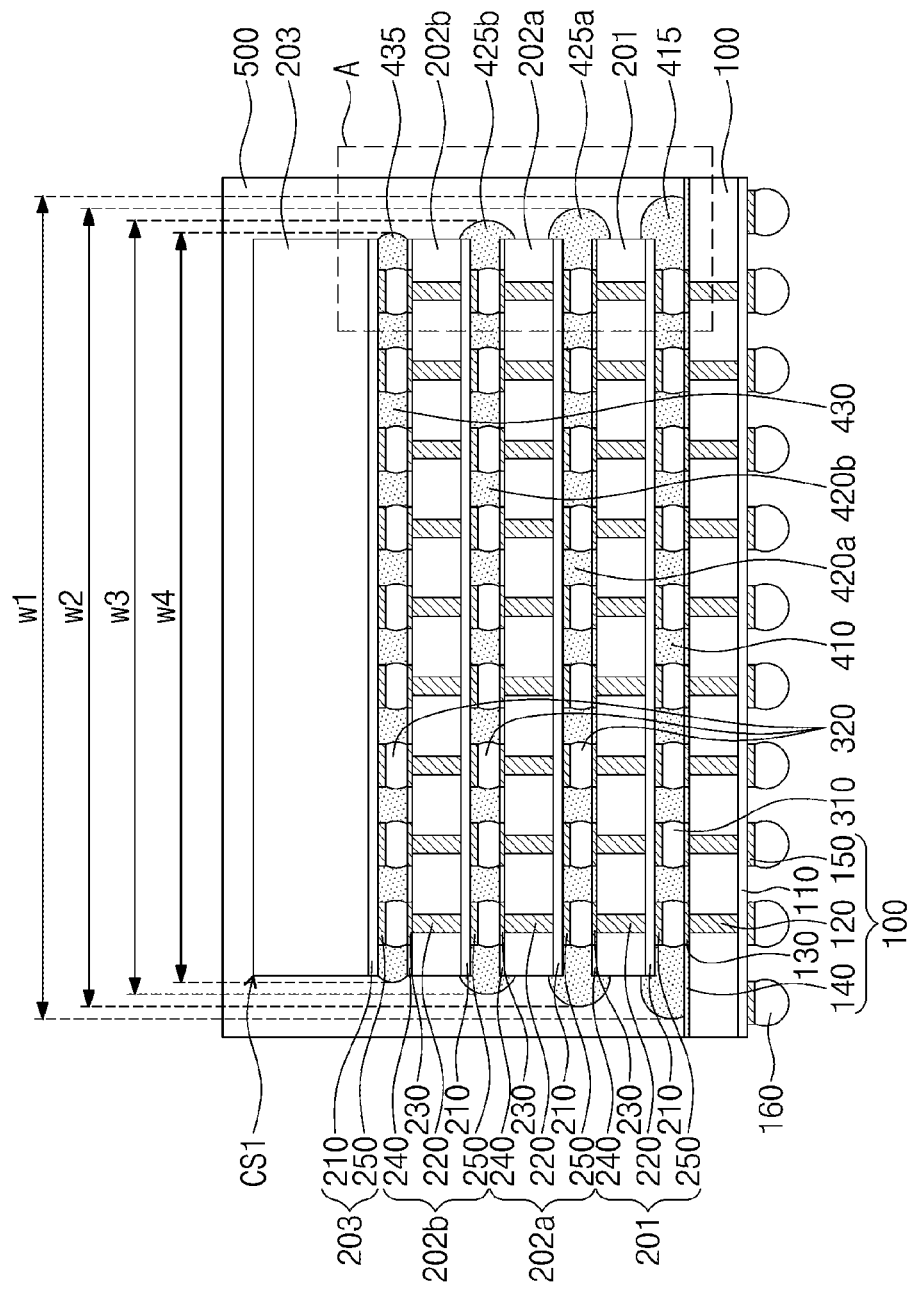
FIG. 1 illustrates a cross-sectional view showing a semiconductor package according to some embodiments of the present inventive concepts.

FIG. 1 illustrates a cross-sectional view showing a semiconductor package according to some embodiments of the present inventive concepts. FIGS. 2 to 5 illustrate enlarged views showing section A of FIG. 1.

A semiconductor package according to some embodiments of the present inventive concepts may be a stacked semiconductor package in which vias are used. For example, semiconductor chips of the same type may be stacked on a base substrate, and the semiconductor chips may be electrically connected to each other through vias that penetrate therethrough. The semiconductor chips may be coupled to each other through chip terminals provided on bottom surfaces thereof.

Referring to FIG. 1, a base substrate 100 may be provided. The base substrate 100 may include an integrated circuit therein. The base substrate 100 may be a first semiconductor chip that includes an electronic device such as a transistor. For example, the base substrate 100 may be a wafer-level die formed of a semiconductor such as silicon (Si). FIG. 1 shows that the base substrate 100 is a first semiconductor chip, but the present inventive concepts are not limited thereto. According to some embodiments of the present inventive concepts, the base substrate 100 may be a substrate, such as printed circuit board, which does not include an electronic device such as a transistor. A silicon wafer may have a thickness less than that of a printed circuit board (PCB). The following will describe an example in which the base substrate 100 and a first semiconductor chip are the same component.

The first semiconductor chip 100 may include a first circuit layer 110, a first via 120, a first upper pad 130, a first protection layer 140, and a first lower pad 150.

The first circuit layer 110 may be provided on a bottom surface of the first semiconductor chip 100. The first circuit layer 110 may include the integrated circuit. For example, the first circuit layer 110 may be a memory circuit, a logic circuit, or a combination thereof. In this case, the bottom surface of the first semiconductor chip 100 may be an active surface.

The first via 120 may vertically penetrate the first semiconductor chip 100. For example, the first via 120 may connect the first circuit layer 110 to a top surface of the first semiconductor chip 100. The first via 120 and the first circuit layer 110 may be electrically connected to each other. The first via 120 may be provided in plural. A dielectric layer may be provided as needed to surround the first via 120. For example, the dielectric layer may include at least one selected from silicon oxide (SiO), silicon nitride (SiN), silicon oxynitride (SiON), or low-k dielectric layers.

The first upper pad 130 may be disposed on the top surface of the first semiconductor chip 100. The first upper pad 130 may be coupled to the first via 120. The first upper pad 130 may be provided in plural. In this case, the plurality of first upper pads 130 may be correspondingly coupled to a plurality of first vias 120, and an arrangement of the first upper pads 130 may conform to that of the first vias 120. The first upper pad 130 may be coupled through the first via 120 to the first circuit layer 110. The first upper pad 130 may include a metallic material, such as one or more of copper (Cu), aluminum (Al), nickel (Ni), and any other suitable element.

The first protection layer 140 may be disposed on the top surface of the first semiconductor chip 100, thereby surrounding the first upper pad 130. The first protection layer 140 may expose the first upper pad 130. The first protection layer 140 may protect the first semiconductor chip 100. The first protection layer 140 may be a dielectric coating layer including epoxy resin.

The first lower pad 150 may be disposed on the bottom surface of the first semiconductor chip 100. For example, the first lower pad 150 may be disposed on a bottom surface of the first circuit layer 110. The first lower pad 150 may be electrically connected to the first circuit layer 110. The first lower pad 150 may be provided in plural. The first lower pad 150 may include a metallic material, such as one or more of copper (Cu), aluminum (Al), nickel (Ni), and any other suitable element.

Although not shown, the first semiconductor chip 100 may further include a lower protection layer (not shown). The lower protection layer may be disposed on the bottom surface of the first semiconductor chip 100, thereby covering the first circuit layer 110. The lower protection layer may protect the first circuit layer 110. The lower protection layer may include a silicon nitride (SiN) layer.

The first semiconductor chip 100 may be provided with an external terminal 160 on the bottom surface thereof. The external terminal 160 may be disposed on the first lower pad 150. The external terminal 160 may be electrically connected to the first circuit layer 110 and the first via 120. Alternatively, the external terminal 160 may be disposed below the first via 120. In this case, the first via 120 may penetrate the first circuit layer 110 and may be exposed at or on the bottom surface of the first circuit layer 110, and the external terminal 160 may be directly coupled to the first via 120. The external terminal 160 may be provided in plural. In this case, the plurality of external terminals 160 may be correspondingly coupled to a plurality of first lower pads 150. The external terminal 160 may be an alloy that includes at least one selected from tin (Sn), silver (Ag), copper (Cu), nickel (Ni), bismuth (Bi), indium (In), antimony (Sb), and cerium (Ce).

A first chip stack CS1 may be disposed on the first semiconductor chip 100. The first chip stack CS1 may include a plurality of second semiconductor chips 201, 202a, 202b, and 203. The second semiconductor chips 201, 202a, 202b, and 203 may be of the same type. For example, the second semiconductor chips 201, 202a, 202b, and 203 may be memory chips. The first chip stack CS1 may include a first lower semiconductor chip 201 directly connected to the first semiconductor chip 100, first intermediate semiconductor chips 202a and 202b disposed on the first lower semiconductor chip 201, and a first upper semiconductor chip 203 disposed on the first intermediate semiconductor chips 202a and 202b. The first lower semiconductor chip 201, the first intermediate semiconductor chips 202a and 202b, and the first upper semiconductor chip 203 may be sequentially stacked on the first semiconductor chip 100. The first intermediate semiconductor chips 202a and 202b may be stacked on each other between the first lower semiconductor chip 201 and the first upper semiconductor chip 203. In some embodiments, it is explained that two first intermediate semiconductor chips 202a and 202b are interposed between the first lower semiconductor chip 201 and the first upper semiconductor chip 203, but the present inventive concepts are not limited thereto. In some embodiments, the first lower semiconductor chip 201 and the first upper semiconductor chip 203 may be provided therebetween with one first intermediate semiconductor chip or with three or more first intermediate semiconductor chips, or may be provided therebetween with no first intermediate semiconductor chip.

The first lower semiconductor chip 201 may have a second circuit layer 210 that faces the first semiconductor chip 100. The second circuit layer 210 may include the integrated circuit. For example, the second circuit layer 210 may include a memory circuit. In this case, a bottom surface of the first lower semiconductor chip 201 may be an active surface.

The first lower semiconductor chip 201 may have a second protection layer 240 that is disposed opposite to the second circuit layer 210. The second protection layer 240 may protect the first lower semiconductor chip 201. The second protection layer 240 may be a dielectric coating layer including epoxy resin.

The first lower semiconductor chip 201 may have a second via 220 that may penetrate a portion of the first lower semiconductor chip 201 in a direction from the second protection layer 240 toward the second circuit layer 210. The second via 220 may be provided in plural. A dielectric layer may be provided to surround the second via 220. For example, the dielectric layer may include at least one selected from silicon oxide (SiO), silicon nitride (SiN), silicon oxynitride (SiON), or low-k dielectric layers. The second via 220 may be electrically connected to the second circuit layer 210.

A second upper pad 230 may be disposed in the second protection layer 240. The second upper pad 230 may have a top surface that is exposed by the second protection layer 240. The second upper pad 230 may be connected to the second via 220. A second lower pad 250 may be disposed on the second circuit layer 210. For example, the second lower pad 250 may be disposed on a bottom surface of the second circuit layer 210. The second lower pad 250 may be coupled to the second circuit layer 210. The second upper pad 230 and the second lower pad 250 may be electrically connected to each other through the second circuit layer 210 and the second via 220. The second upper pad 230 and the second lower pad 250 may each be provided in plural. The second upper pad 230 and the second lower pad 250 may include a metallic material, such as one or more of copper (Cu), aluminum (Al), nickel (Ni), and any other suitable element.

The first intermediate semiconductor chips 202a and 202b may each have a structure substantially the same as that of the first lower semiconductor chip 201. For example, each of the first intermediate semiconductor chips 202a and 202b may include the second circuit layer 210 that faces the first semiconductor chip 100, the second protection layer 240 that is disposed opposite to the second circuit layer 210, the second via 220 that penetrates the first intermediate semiconductor chips 202a and 202b in a direction from the second protection layer 240 toward the second circuit layer 210, the second upper pad 230 in the second protection layer 240, and the second lower pad 250 on the second circuit layer 210.

The first upper semiconductor chip 203 may have a structure substantially similar to that of the first lower semiconductor chip 201. For example, the first upper semiconductor chip 203 may include the second circuit layer 210 that faces the first semiconductor chip 100 and the second lower pad 250 on the second circuit layer 210. The first upper semiconductor chip 203 may not include the second via 220, the second upper pad 230, and the second protection layer 240. The present inventive concepts, however, are not limited thereto. In some embodiments, the first upper semiconductor chip 203 may include at least one selected from the second via 220, the second upper pad 230, and the second protection layer 240. The first upper semiconductor chip 203 may have a thickness greater than that of the first lower semiconductor chip 201 and greater than those of the first intermediate semiconductor chips 202a and 202b.

Figure 2:
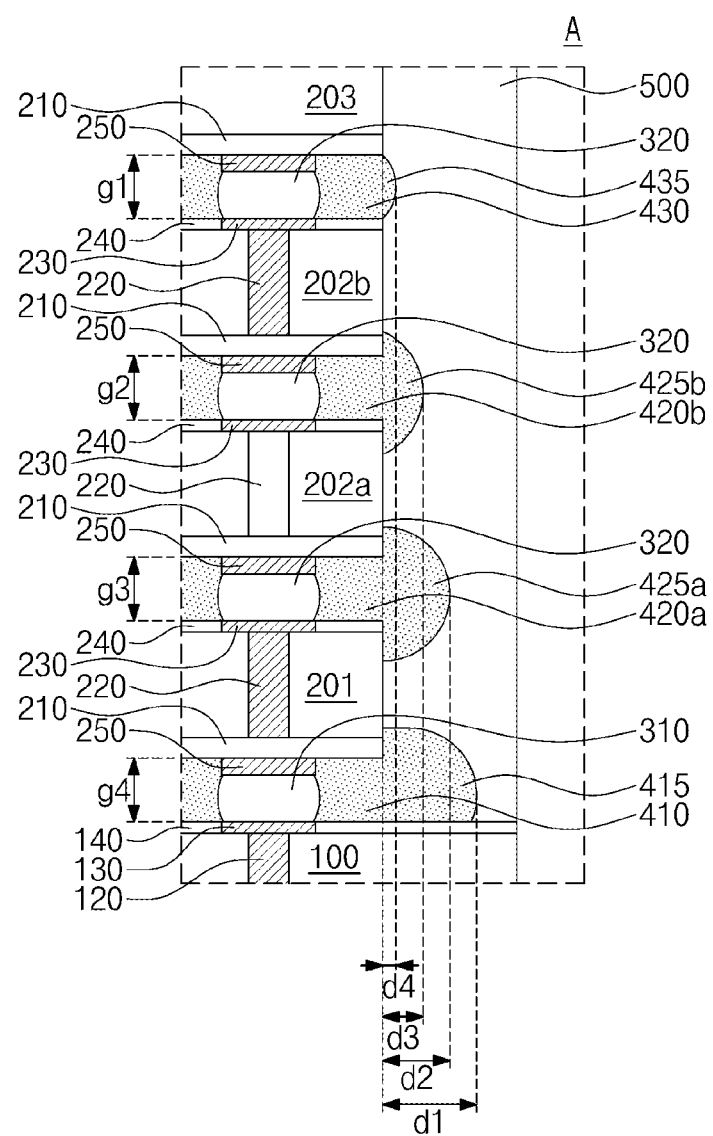
FIGS. 2, 3, 4, and 5 illustrate enlarged views showing section A of FIG. 1.
Figure 3:
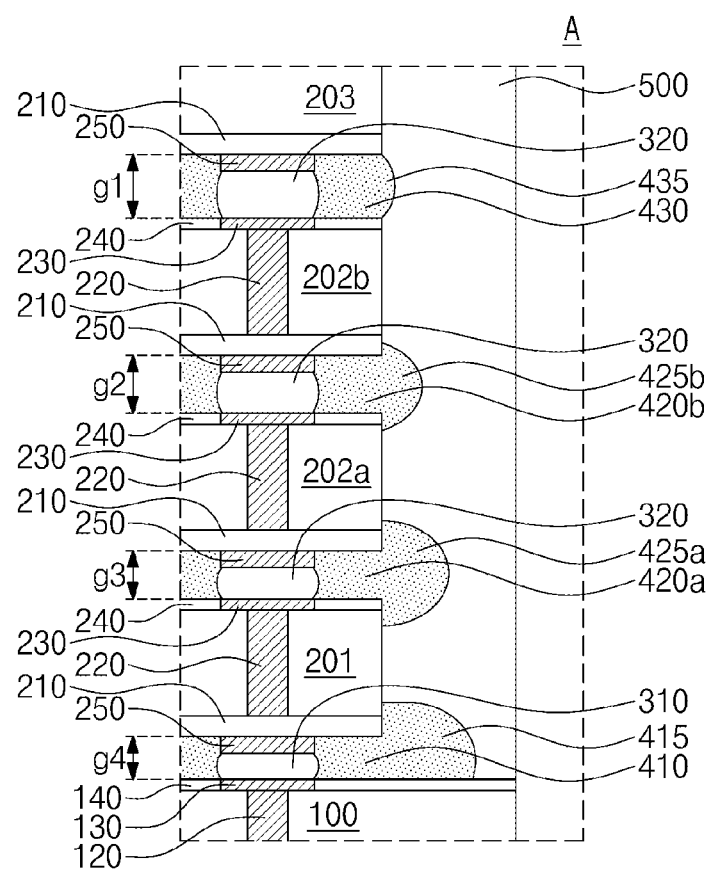

As shown in FIG. 2, an interval or spacing g4 between the first semiconductor chip 100 and the first lower semiconductor chip 201 may be the same as intervals or spacings g1, g2, and g3 between neighboring ones of the second semiconductor chips 201, 202a, 202b, and 203. Alternatively, as shown in FIG. 3, the intervals g1, g2, g3, and g4 between the semiconductor chips 203, 202b, 202a, 201, and 100 may decrease in a direction toward the first semiconductor chip 100. For example, the interval g4 between the first semiconductor chip 100 and the first lower semiconductor chip 201 may be less than the interval g3 between the first lower semiconductor chip 201 and a lowermost first intermediate semiconductor chip 202a, the interval g3 between the first lower semiconductor chip 201 and the lowermost first intermediate semiconductor chip 202a may be less than the interval g2 between the first intermediate semiconductor chips 202a and 202b, and the interval g2 between the first intermediate semiconductor chips 202a and 202b may be less than the interval g1 between an uppermost first intermediate semiconductor chip 202b and the first upper semiconductor chip 203. The present inventive concepts, however, are not limited thereto. In some embodiments, the interval g4 between the first semiconductor chip 100 and the first lower semiconductor chip 201 may be less than the intervals g3, g2, and g1 between the second semiconductor chips 201, 202a, 202b, and 203, and the intervals g3, g2, and g1 between the second semiconductor chips 201, 202a, 202b, and 203 may be substantially the same as or similar to each other. The following description will focus on the embodiment of FIG. 2. The second semiconductor chips 201, 202a, 202b, and 203 may have the same width. The second semiconductor chips 201, 202a, 202b, and 203 may be vertically aligned with each other. For example, the second semiconductor chips 201, 202a, 202b, and 203 may have their lateral surfaces positioned on an imaginary plane perpendicular to the top surface of the first semiconductor chip 100.

The first semiconductor chip 100 and neighboring ones of the second semiconductor chips 201, 202a, 202b, and 203 may be connected to each other through first chip terminals 310 and 320. The first chip terminals 310 and 320 may include a first lower chip terminal 310 that connects the first semiconductor chip 100 to the first chip stack CS1, and may also include first upper chip terminals 320 that connect to each other neighboring second semiconductor chips 201, 202a, 202b, and 203. The first lower chip terminal 310 and the first upper chip terminals 320 may be solder balls that include at least one selected from tin (Sn), silver (Ag), copper (Cu), nickel (Ni), bismuth (Bi), indium (In), antimony (Sb), and cerium (Ce).

The first lower chip terminal 310 may be disposed between the first upper pad 130 of the first semiconductor chip 100 and the second lower pad 250 of the first lower semiconductor chip 201. The first lower chip terminal 310 may have a thickness the same as a distance between the first upper pad 130 and the second lower pad 250. The first lower chip terminal 310 may be provided in plural. The first lower chip terminal 310 may electrically connect the first semiconductor chip 100 to the first lower semiconductor chip 201.

The first upper chip terminals 320 may connect the first lower semiconductor chip 201 to the lowermost first intermediate semiconductor chip 202a, may connect the first intermediate semiconductor chips 202a and 202b to each other, and may connect the uppermost first intermediate semiconductor chip 202b to the first upper semiconductor chip 203. The first upper chip terminals 320 may be disposed between the second upper pad 230 of the first lower semiconductor chip 201 and the second lower pad 250 of the lowermost first intermediate semiconductor chip 202a, between the second upper pad 230 of the lowermost first intermediate semiconductor chip 202a and the second lower pad 250 of the uppermost first intermediate semiconductor chip 202b, and between the second upper pad 230 of the uppermost first intermediate semiconductor chip 202b and the second lower pad 250 of the first upper semiconductor chip 203. Based on a position of the first upper chip terminal 320, the first upper chip terminal 320 may have a thickness the same as one of a distance between the second upper pad 230 of the first lower semiconductor chip 201 and the second lower pad 250 of the lowermost first intermediate semiconductor chip 202a, a distance between the second upper pad 230 of the lowermost first intermediate semiconductor chip 202a and the second lower pad 250 of the uppermost first intermediate semiconductor chip 202b, and a distance between the second upper pad 230 of the uppermost first intermediate semiconductor chip 202b and the second lower pad 250 of the first upper semiconductor chip 203. The first upper chip terminal 320 may be provided in plural between the first lower semiconductor chip 201 and the lowermost first intermediate semiconductor chip 202a, between the first intermediate semiconductor chips 202a and 202b, and the uppermost first intermediate semiconductor chip 202b and the first upper semiconductor chip 203. The first upper chip terminals 320 may electrically connect the second semiconductor chips 201, 202a, 202b, and 203 to each other.

First non-conductive layers 410, 420a, 420b, and 430 may be disposed between the first semiconductor chip 100 and the first chip stack CS1 and between neighboring second semiconductor chips 201, 202a, 202b, and 203, thereby surrounding the first chip terminals 310 and 320. The first non-conductive layers 410, 420a, 420b, and 430 may include a first lower non-conductive layer 410 provided below the first lower semiconductor chip 201, intermediate non-conductive layers 420a and 420b correspondingly provided below the first intermediate semiconductor chips 202a and 202b, and a first upper non-conductive layer 430 provided below the first upper semiconductor chip 203.

The first lower non-conductive layer 410 may be disposed between the first semiconductor chip 100 and the first lower semiconductor chip 201, thereby surrounding the first lower chip terminals 310. The first lower non-conductive layer 410 may have a first extension 415 that outwardly protrudes from the lateral surface of the first lower semiconductor chip 201. The first extension 415 may be supported by the first semiconductor chip 100.

The intermediate non-conductive layers 420a and 420b may include a first intermediate non-conductive layer 420a and a second intermediate non-conductive layer 420b. The first intermediate non-conductive layer 420a may be disposed between the first lower semiconductor chip 201 and the lowermost first intermediate semiconductor chip 202a, thereby surrounding the first upper chip terminals 320. The first intermediate non-conductive layer 420a may have a second extension 425a that outwardly protrudes from the lateral surface of the lowermost first intermediate semiconductor chip 202a and/or the lateral surface of the first lower semiconductor chip 201. The second intermediate non-conductive layer 420b may be disposed between the first intermediate semiconductor chips 202a and 202b, thereby surrounding the first upper chip terminals 320. The second intermediate non-conductive layer 420b may have a third extension 425b that outwardly protrudes from the lateral surface of the uppermost first intermediate semiconductor chip 202b and/or the lateral surface of the lowermost first intermediate semiconductor chip 202a.

The first upper non-conductive layer 430 may be disposed between the upside first intermediate semiconductor chip 202b and the first upper semiconductor chip 203, thereby surrounding the first upper chip terminals 320. The first upper non-conductive layer 430 may have a fourth extension 435 that outwardly protrudes from the lateral surface of the first upper semiconductor chip 203.

Each of the first, second, third, and fourth extensions 415, 425a, 425b, and 435 may partially cover the lateral surface of its overlying one of the second semiconductor chips 201, 202a, 202b, and 203. Each of the first, second, third, and fourth extensions 415, 425a, 425b, and 435 may have a thickness greater than that between corresponding ones of the semiconductor chips 100, 201, 202a, 202b, and 203. The first, second, third, and fourth extensions 415, 425a, 425b, and 435 may be vertically spaced apart from each other without being in contact with each other.

As shown in FIG. 2, the first non-conductive layers 410, 420a, 420b, and 430 may have the same thickness. In this description, a thickness of a non-conductive layer is defined as a thickness of a portion of the non-conductive layer, which portion is interposed between semiconductor chips. Different from the thickness of the non-conductive layer, an extension of the non-conductive layer may have a thickness that is referred to separately. The thickness of each of the first non-conductive layers 410, 420a, 420b, and 430 may correspond to one of the interval g4 between the first semiconductor chip 100 and the first lower semiconductor chip 201 and the intervals g3, g2, and g1 between neighboring ones of the second semiconductor chips 201, 202a, 202b, and 203. For example, the thickness of the first lower non-conductive layers 410 may be the same as the interval g4 between the first semiconductor chip 100 and the first lower semiconductor chip 201, the thickness of the first intermediate non-conductive layer 420a may be the same as the interval g3 between the first lower semiconductor chip 201 and the lowermost first intermediate semiconductor chip 202a, the thickness of the second intermediate non-conductive layer 420b may be the same as the interval g2 between the first intermediate semiconductor chips 202a and 202b, and the thickness of the first upper non-conductive layer 430 may correspond to the interval g1 between the uppermost first intermediate semiconductor chip 202b and the first upper semiconductor chip 203. Alternatively, as shown in FIG. 3, the thicknesses of the first non-conductive layers 410, 420a, 420b, and 430 may decrease in a direction toward the first semiconductor chip 100. For example, the thickness of the first lower non-conductive layer 410 may be less than that of the first intermediate non-conductive layer 420a, the thickness of the first intermediate non-conductive layer 420a may be less than that of the second intermediate non-conductive layer 420b, and the thickness of the second intermediate non-conductive layer 420b may be less than that of the first upper non-conductive layer 430.

The first non-conductive layers 410, 420a, 420b, and 430 may have their widths that increase in a direction toward the first semiconductor chip 100. For example, the first lower non-conductive layer 410 may have a first width w1 greater than a second width w2 of the first intermediate non-conductive layer 420a, the second width w2 of the first intermediate non-conductive layer 420a may be greater than a third width w3 of the second intermediate non-conductive layer 420b, and the third width w3 of the second intermediate non-conductive layer 420b may be greater than a fourth width w4 of the first upper non-conductive layer 430. As the second semiconductor chips 201, 202a, 202b, and 203 have the same width, the first non-conductive layers 410, 420a, 420b, and 430 may have different protruding lengths from the lateral or side surfaces of the second semiconductor chips 201, 202a, 202b, and 203. For example, as shown in FIG. 2, the first extension 415 of the first lower non-conductive layer 410 may have a first protruding length d1 greater than a second protruding length d2 of the second extension 425a included in the first intermediate non-conductive layer 420a, the second protruding length d2 of the second extension 425a included in the first intermediate non-conductive layer 420a may be greater than a third protruding length d3 of the third extension 425b included in the second intermediate non-conductive layer 420b, and the third protruding length d3 of the third extension 425b included in the second intermediate non-conductive layer 420b may be greater than a fourth protruding length d4 of the fourth extension 435 included in the first upper non-conductive layer 430.

Figure 4:
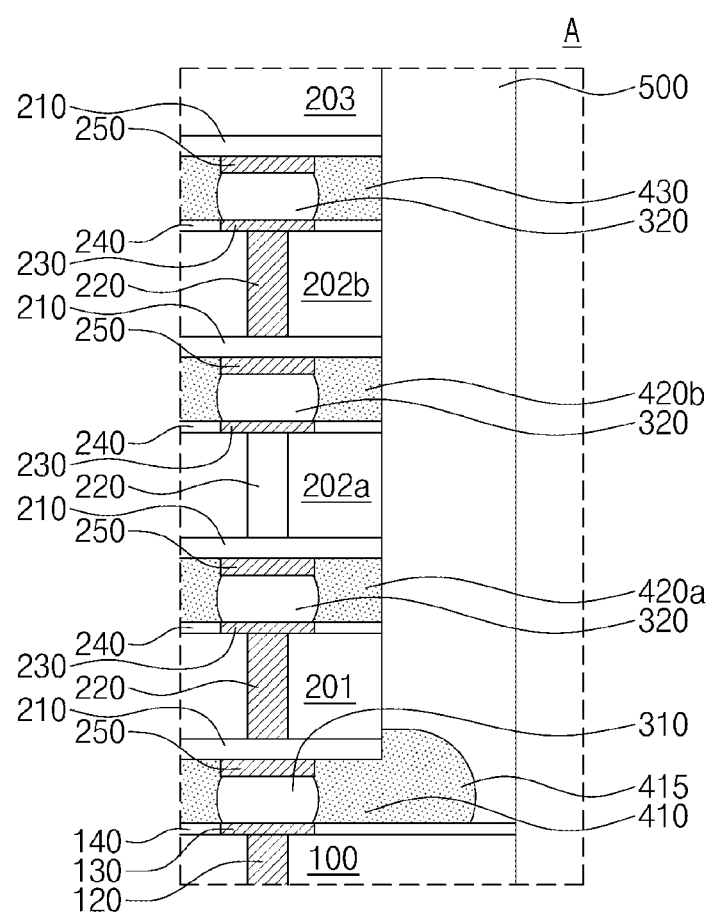

In some embodiments, as shown in FIG. 4, the first lower non-conductive layer 410 may have a first width greater than a second width of the first intermediate non-conductive layer 420a, than a third width of the second intermediate non-conductive layer 420b, and than a fourth width of the first upper non-conductive layer 430, and the second and third widths of the first and second intermediate non-conductive layers 420a and 420b and the fourth width of the first upper non-conductive layer 430 may be the same as the widths of the second semiconductor chips 201, 202a, 202b, and 203. For example, the lateral or side surfaces of the second semiconductor chips 201, 202a, 202b, and 203 may be coplanar with those of the first and second intermediate non-conductive layers 420a and 420b and with that of the first upper non-conductive layer 430.

Figure 5:
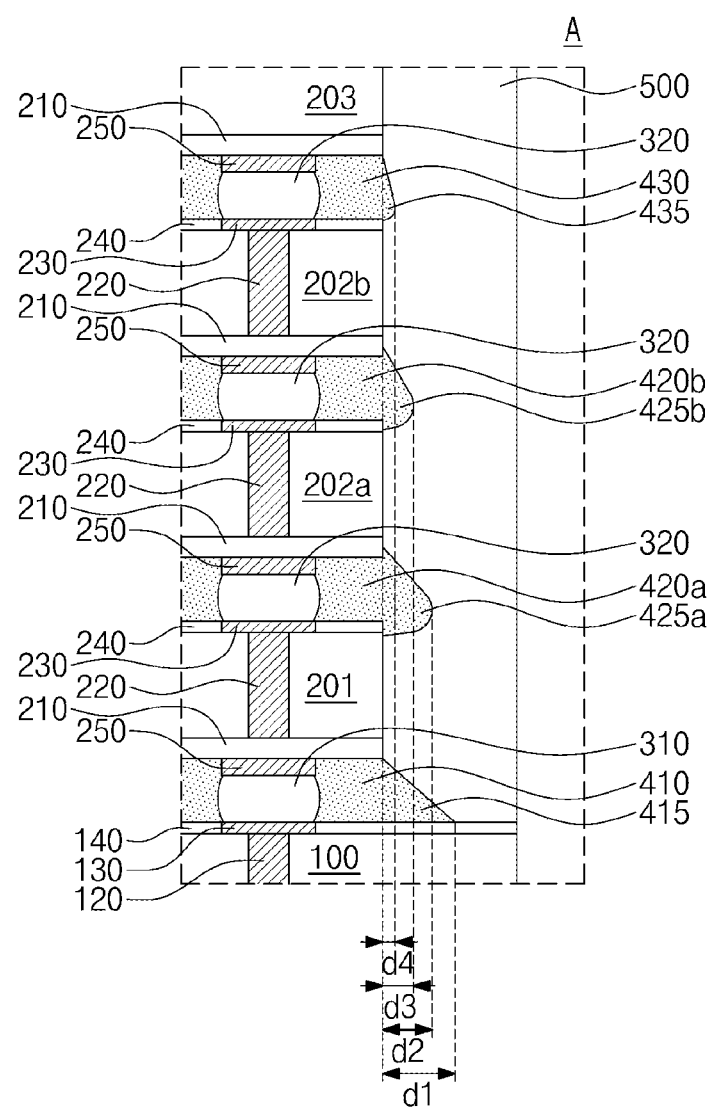

Referring still to FIGS. 1 and 2, the extensions 415, 425a, 425b, and 435 may have their shapes that protrude from the lateral surfaces of the second semiconductor chips 201, 202a, 202b, and 203. For example, the extensions 415, 425a, 425b, and 435 may have their convex shapes (e.g., hemispherical shapes) on the lateral surfaces of the second semiconductor chips 201, 202a, 202b, and 203 Alternatively, as shown in FIG. 5, the extensions 415, 425a, 425b, and 435 may have their shapes (e.g., triangular shapes) whose widths increase in a direction toward the first semiconductor chip 100. In this description, a width of the extension may correspond to a distance from the lateral surface of the semiconductor chip to an outermost point of the extension, and may correspond to the mentioned protruding length of the extension.

Each of the first non-conductive layers 410, 420a, 420b, and 430 may have rigidity (or hardness) different from those of others of the first non-conductive layers 410, 420a, 420b, and 430. The rigidities of the first non-conductive layers 410, 420a, 420b, and 430 may increase in a direction toward the first semiconductor chip 100. For example, the first lower non-conductive layer 410 may have a first rigidity greater than a second rigidity of the first intermediate non-conductive layer 420a, the second rigidity of the first intermediate non-conductive layer 420a may be greater than a third rigidity of the second intermediate non-conductive layer 420b, and the third rigidity of the second intermediate non-conductive layer 420b may be greater than a fourth rigidity of the first upper non-conductive layer 430. The difference in rigidity between the first non-conductive layers 410, 420a, 420b, and 430 may be attributed to a difference in the degree of curing between the first non-conductive layers 410, 420a, 420b, and 430 in semiconductor package fabrication. This will be further discussed below in detail in describing a method of fabricating a semiconductor package.

According to some embodiments of the present inventive concepts, a load imposed on the first lower non-conductive layer 410 may be significantly heavier or greater than that imposed on any other of the first non-conductive layers 410, 420a, 420b, and 430, and the first rigidity of the first lower non-conductive layer 410 may be greater than the second, third, and fourth rigidities of the other non-conductive layers 420a, 420b, and 430, with the result that the first chip stack CS1 may be firmly supported on the first semiconductor chip 100. Accordingly, a semiconductor package may be provided to have increased structural stability.

The first non-conductive layers 410, 420a, 420b, and 430 may include the same material. For example, the first non-conductive layers 410, 420a, 420b, and 430 may include a non-conductive film (NCF) or a non-conductive paste (NCP). The first non-conductive layers 410, 420a, 420b, and 430 may include a dielectric polymer. For example, the first lower non-conductive layer 410, the first and second intermediate non-conductive layers 420a and 420b, and the first upper non-conductive layer 430 may be formed of an epoxy-based material without conductive particles. The use of the first non-conductive layers 410, 420a, 420b, and 430 without conductive particles may cause the first upper chip terminals 320 to have a fine pitch with no electrical short-circuit between neighboring first upper chip terminals 320. In addition, the first non-conductive layers 410, 420a, 420b, and 430 may serve as under fill layers that fills a space between the first semiconductor chip 100 and the first chip stack CS1 and a space between neighboring ones of the second semiconductor chips 201, 202a, 202b, and 203, and thus the first chip terminals 310 and 320 may have increased mechanical durability.

The first non-conductive layers 410, 420a, 420b, and 430 may have their thermal expansion coefficients different from that of the first semiconductor chip 100, those of the second semiconductor chips 201, 202a, 202b, and 203, and that of a molding layer 500 which will be discussed below. Therefore, a semiconductor package may suffer from warpage due to heat generated when the semiconductor package is fabricated or operated.

According to some embodiments of the present inventive concepts, because the first lower non-conductive layer 410 is attached to and supported by the wide top surface of the first semiconductor chip 100, it may be possible to suppress warpage caused by the first lower non-conductive layer 410. In addition, the first and second intermediate non-conductive layers 420a and 420b and the first upper non-conductive layer 430, which are disposed spaced apart from the first semiconductor chip 100, may be provided to have a width less than that of the first lower non-conductive layer 410, such that it may be possible to reduce or minimize the occurrence of warpage resulting from the first and second intermediate non-conductive layers 420a and 420b and the first upper non-conductive layer 430. When the first and second intermediate non-conductive layers 420a and 420b and the first upper non-conductive layer 430 are provided to have the same width as that of the second semiconductor chips 201, 202a, 202b, and 203, it may be possible to reduce or minimize the occurrence of warpage resulting from the first and second intermediate non-conductive layers 420a and 420b and the first upper non-conductive layer 430. It may thus be possible to minimize warpage caused by the first non-conductive layers 410, 420a, 420b, and 430, to protect the first chip terminals 310 and 320 against stress induced from the first non-conductive layers 410, 420a, 420b, and 430, and to prevent delamination of the semiconductor chips 100, 201, 202a, 202b, and 203. As a result, a semiconductor package may be provided to have increased structural stability.

Referring back to FIG. 1, a molding layer 500 may be provided on the first semiconductor chip 100. The molding layer 500 may cover the top surface of the first semiconductor chip 100. The molding layer 500 may have a lateral or side surface coplanar with that of the first semiconductor chip 100. The molding layer 500 may encapsulate the first chip stack CS1. For example, the molding layer 500 may cover the lateral or side surfaces of the second semiconductor chips 201, 202a, 202b, and 203. In this case, a distance between an outer surface of the molding layer 500 and a distal end of each of the first upper non-conductive layer 430 and the first and second intermediate non-conductive layers 420a and 420b may be greater than a distance between the outer surface of the molding layer 500 and a distal end of the first lower non-conductive layer 410. The distance between the outer surface of the molding layer 500 and the distal end of the first lower non-conductive layer 410 may range from about 100 µm to about 500 µm. The molding layer 500 may protect the second semiconductor chips 201, 202a, 202b, and 203. The molding layer 500 may include a dielectric material. For example, the molding layer 500 may include an epoxy molding compound (EMC). The molding layer 500 may be formed to cover the second semiconductor chips 201, 202a, 202b, and 203. For example, the molding layer 500 may cover a top surface of the first upper semiconductor chip 203. Differently from that shown, the molding layer 500 may expose the top surface of the first upper semiconductor chip 203.

FIGS. 1 to 5 depict that the first chip stack CS1 includes four second semiconductor chips 201, 202a, 202b, and 203 which are stacked on the first semiconductor chip 100.

Figure 6:
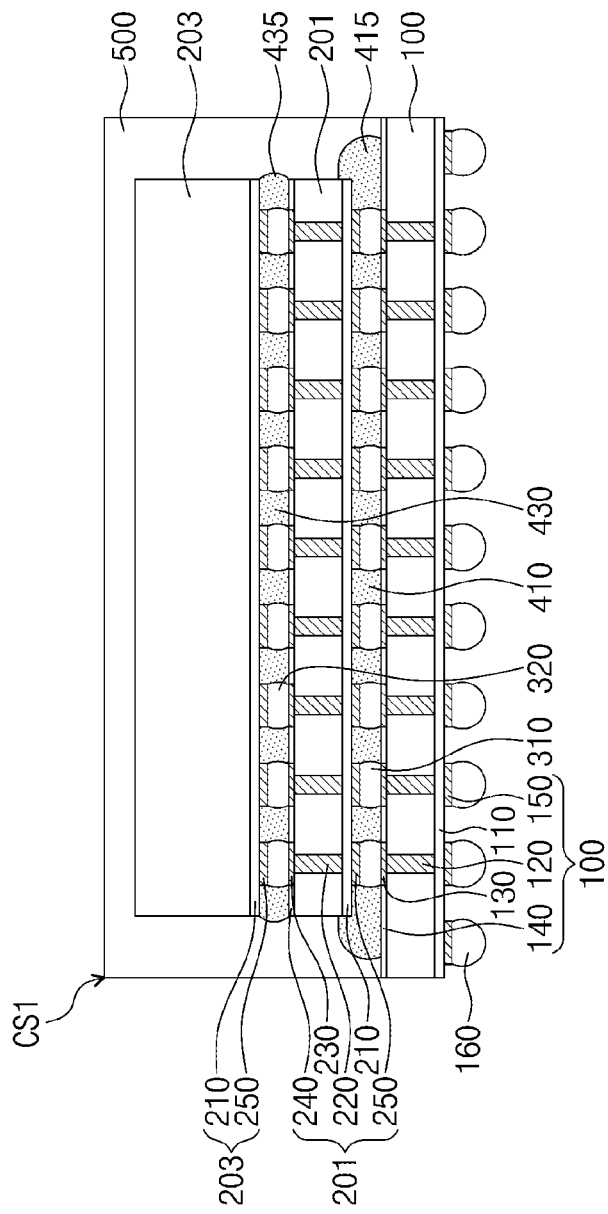
FIGS. 6 and 7 illustrate cross-sectional views showing a semiconductor package according to some embodiments of the present inventive concepts.

FIG. 6 illustrates a cross-sectional view showing a semiconductor package according to some embodiments of the present inventive concepts.

Referring to FIG. 6, the first chip stack CS1 may not include the first intermediate semiconductor chips (see 202a and 202b of FIG. 1). For example, the first chip stack CS1 may include a first lower semiconductor chip 201 directly connected to the first semiconductor chip 100 and a first upper semiconductor chip 203 disposed on the first lower semiconductor chip 201.

The first lower chip terminal 310 may be disposed between the first upper pad 130 of the first semiconductor chip 100 and the second lower pad 250 of the first lower semiconductor chip 201, and may electrically connect the first semiconductor chip 100 to the first lower semiconductor chip 201. The first upper chip terminal 320 may be disposed between the second upper pad 230 of the first lower semiconductor chip 201 and the second lower pad 250 of the first upper semiconductor chip 203, and may electrically connect the second semiconductor chips 201 and 203 to each other.

The first non-conductive layers 410 and 430 may include a lower non-conductive layer 410 provided below the first lower semiconductor chip 201 and a first upper non-conductive layer 430 provided below the first upper semiconductor chip 203.

The first lower non-conductive layer 410 may be disposed between the first semiconductor chip 100 and the first lower semiconductor chip 201, thereby surrounding the first lower chip terminals 310. The first lower non-conductive layer 410 may have the first extension 415 that outwardly protrudes from the lateral or side surface of the first lower semiconductor chip 201.

The first upper non-conductive layer 430 may be disposed between the first lower non-conductive layer 410 or the first lower semiconductor chip 201 and the first upper semiconductor chip 203, thereby surrounding the first upper chip terminals 320. The first upper non-conductive layer 430 may have a fourth extension 435 that outwardly protrudes from the lateral or side surface of the first upper semiconductor chip 203.

The first lower non-conductive layer 410 may have a thickness less than that of the first upper non-conductive layer 430. The first lower non-conductive layer 410 may have a first width greater than a fourth width of the first upper non-conductive layer 430. As the second semiconductor chips 201 and 203 have the same width, the first non-conductive layers 410 and 430 may have different protruding lengths from the lateral surfaces of the second semiconductor chips 201 and 203. For example, the first extension 415 of the first lower non-conductive layer 410 may have a first protruding length greater than a fourth protruding length of the fourth extension 435 included in the first upper non-conductive layer 430.

The first non-conductive layers 410 and 430 may have rigidities that are different from each other. For example, the first lower non-conductive layer 410 may have a first rigidity greater than a fourth rigidity of the first upper non-conductive layer 430. The first non-conductive layers 410 and 430 may include the same material as each other. For example, the first non-conductive layers 410 and 430 may include a non-conductive film (NCF) or a non-conductive paste (NCP). The first non-conductive layers 410 and 430 may include a dielectric polymer.

Figure 7:
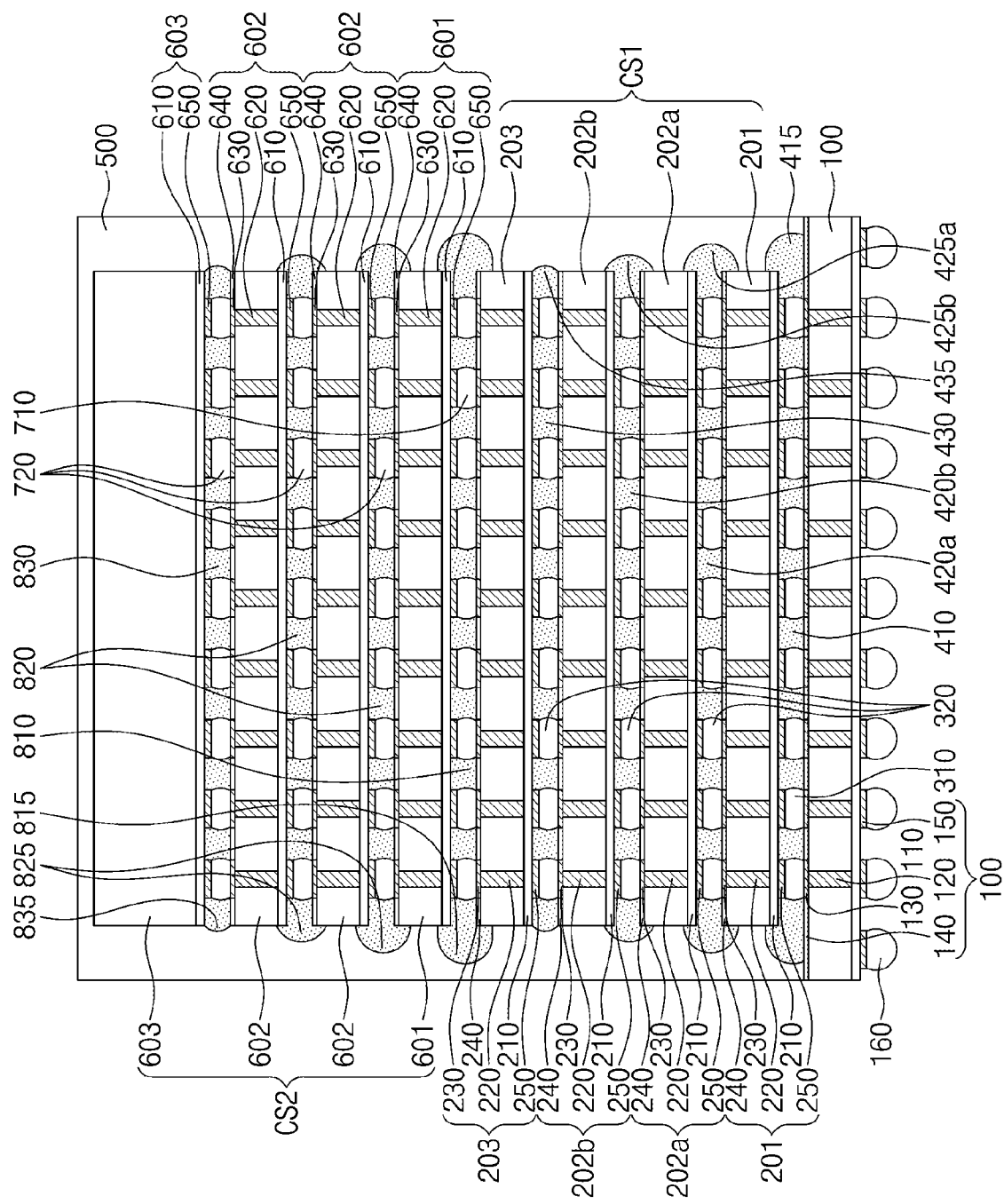

FIG. 7 illustrates a cross-sectional view showing a semiconductor package according to some embodiments of the present inventive concepts.

Referring to FIG. 7, a semiconductor package may further include a second chip stack CS2 on the first chip stack CS1.

The second chip stack CS2 may be disposed on the first upper semiconductor chip 203. The first upper semiconductor chip 203 may include a second circuit layer 210 that faces the first semiconductor chip 100, a second protection layer 240 that is disposed opposite to the second circuit layer 210, a second via 220 that penetrates the first upper semiconductor chip 203 in a direction from the second protection layer 240 toward the second circuit layer 210, a second upper pad 230 in the second protection layer 240, and a second lower pad 250 on the second circuit layer 210.

The second chip stack CS2 may include a plurality of third semiconductor chips 601, 602, and 603. The third semiconductor chips 601, 602, and 603 may be of the same type as the second semiconductor chips 201, 202a, 202b, and 203. For example, the third semiconductor chips 601, 602, and 603 may be memory chips. The second chip stack CS2 may include a second lower semiconductor chip 601 directly connected to the first upper semiconductor chip 203, second intermediate semiconductor chips 602 disposed on the second lower semiconductor chip 601, and a second upper semiconductor chip 603 disposed on the second intermediate semiconductor chips 602. The second lower semiconductor chip 601, the second intermediate semiconductor chips 602, and the second upper semiconductor chip 603 may be sequentially stacked on the first upper semiconductor chip 203. The second intermediate semiconductor chips 602 may be stacked on each other between the second lower semiconductor chip 601 and the second upper semiconductor chip 603. In some embodiments, the second lower semiconductor chip 601 and the second upper semiconductor chip 603 may be provided therebetween with one second intermediate semiconductor chip or with three or more second intermediate semiconductor chips.

The third semiconductor chips 601, 602, and 603 may have substantially the same structure as that of the second semiconductor chips 201, 202a, 202b, and 203. For example, the second lower semiconductor chip 601 and the second intermediate semiconductor chips 602 may each include a third circuit layer 610 that faces the first chip stack CS1, a third protection layer 640 that is disposed opposite to the third circuit layer 610, a third via 620 that penetrates the second lower semiconductor chip 601 in a direction from the third protection layer 640 toward the third circuit layer 610, a third upper pad 630 in the third protection layer 640, and a third lower pad 650 on the third circuit layer 610. The second upper semiconductor chip 603 may include a third circuit layer 610 that faces the first chip stack CS1 and a third lower pad 650 on the third circuit layer 610. The second upper semiconductor chip 603 may not include the third via 620, the third upper pad 630, and the third protection layer 640. The present inventive concepts, however, are not limited thereto. The second upper semiconductor chip 603 may have a thickness greater than that of the second lower semiconductor chip 601 and those of the second intermediate semiconductor chips 602.

The first upper semiconductor chip 203 and the third semiconductor chips 601, 602, and 603 may be connected to each other through second chip terminals 710 and 720. The second chip terminals 710 and 720 may include a second lower chip terminal 710 that connects the first upper semiconductor chip 203 to the second chip stack CS2, and may also include second upper chip terminals 720 that connect to each other neighboring ones of the third semiconductor chips 601, 602, and 603.

Second non-conductive layers 810, 820, and 830 may be disposed between the first upper semiconductor chip 203 and the second chip stack CS2 and between neighboring second semiconductor chips 601, 602, and 603, thereby surrounding the second chip terminals 710 and 720. The second non-conductive layers 810, 820, and 830 may include a second lower non-conductive layer 810 provided below the second lower semiconductor chip 601, third intermediate non-conductive layers 820 correspondingly provided below the second intermediate semiconductor chips 602, and a second upper non-conductive layer 830 provided below the second upper semiconductor chip 603.

The second lower non-conductive layer 810 may have a fifth extension 815 that outwardly protrudes from a lateral or side surface of the second lower semiconductor chip 601 and/or a lateral or side surface of the first upper semiconductor chip 203. The third intermediate non-conductive layers 820 may have their sixth extensions 825 that outwardly protrude from lateral surfaces of the second intermediate semiconductor chips 602 and/or a lateral or side surface of the second lower semiconductor chip 601. The second upper non-conductive layer 830 may have a seventh extension 835 that outwardly protrudes from a lateral surface of the second upper semiconductor chip 603.

The second non-conductive layers 810, 820, and 830 may have their widths that increase in a direction toward the first chip stack CS1. For example, the width of the second lower non-conductive layer 810 may be greater than those of the third intermediate non-conductive layers 820, and the widths of the third intermediate non-conductive layers 820 may be greater than that of the second upper non-conductive layer 830. The width of the second lower non-conductive layer 810 may be greater than the fourth width (see w4 of FIG. 1) of the first upper non-conductive layer 430. The width of the second lower non-conductive layer 810 may be substantially the same as or similar to the first width (see w1 of FIG. 1) of the first lower non-conductive layer 410. For example, the non-conductive layers 410, 420a, 420b, 430, 810, 820, and 830 may have their widths that increase in a direction from the second upper non-conductive layer 830 toward the second lower non-conductive layer 810 or in a direction from the first upper non-conductive layer 430 toward the first lower non-conductive layer 410.

The fifth extension 815 of the second lower non-conductive layer 810 may have a protruding length greater than that of the sixth extension 825 included in each of the third intermediate non-conductive layers 820, and the protruding length of the sixth extension 825 included in each of the third intermediate non-conductive layers 820 may be greater than that of the seventh extension 835 included in the second upper non-conductive layer 830.

The second non-conductive layers 810, 820, and 830 may have rigidities that are different from each other. For example, the rigidities of the second non-conductive layers 810, 820, and 830 may increase in a direction toward the first semiconductor chip 100.

The second non-conductive layers 810, 820, and 830 may include the same material as each other. For example, the second non-conductive layers 810, 820, and 830 may include a non-conductive film (NCF) or a non-conductive paste (NCP).

A molding layer 500 may be provided on the first semiconductor chip 100. The molding layer 500 may encapsulate the first chip stack CS1 and the second chip stack CS2. For example, the molding layer 500 may cover the lateral or side surfaces of the second semiconductor chips 201, 202a, 202b, and 203 and the lateral or side surfaces of the third semiconductor chips 601, 602, and 603. In this case, a distance between an outer lateral surface of the molding layer 500 and distal ends of the third intermediate non-conductive layers 820 may be greater than a distance between the outer lateral surface of the molding layer 500 and a distal end of the second lower non-conductive layer 810.

Figure 8:
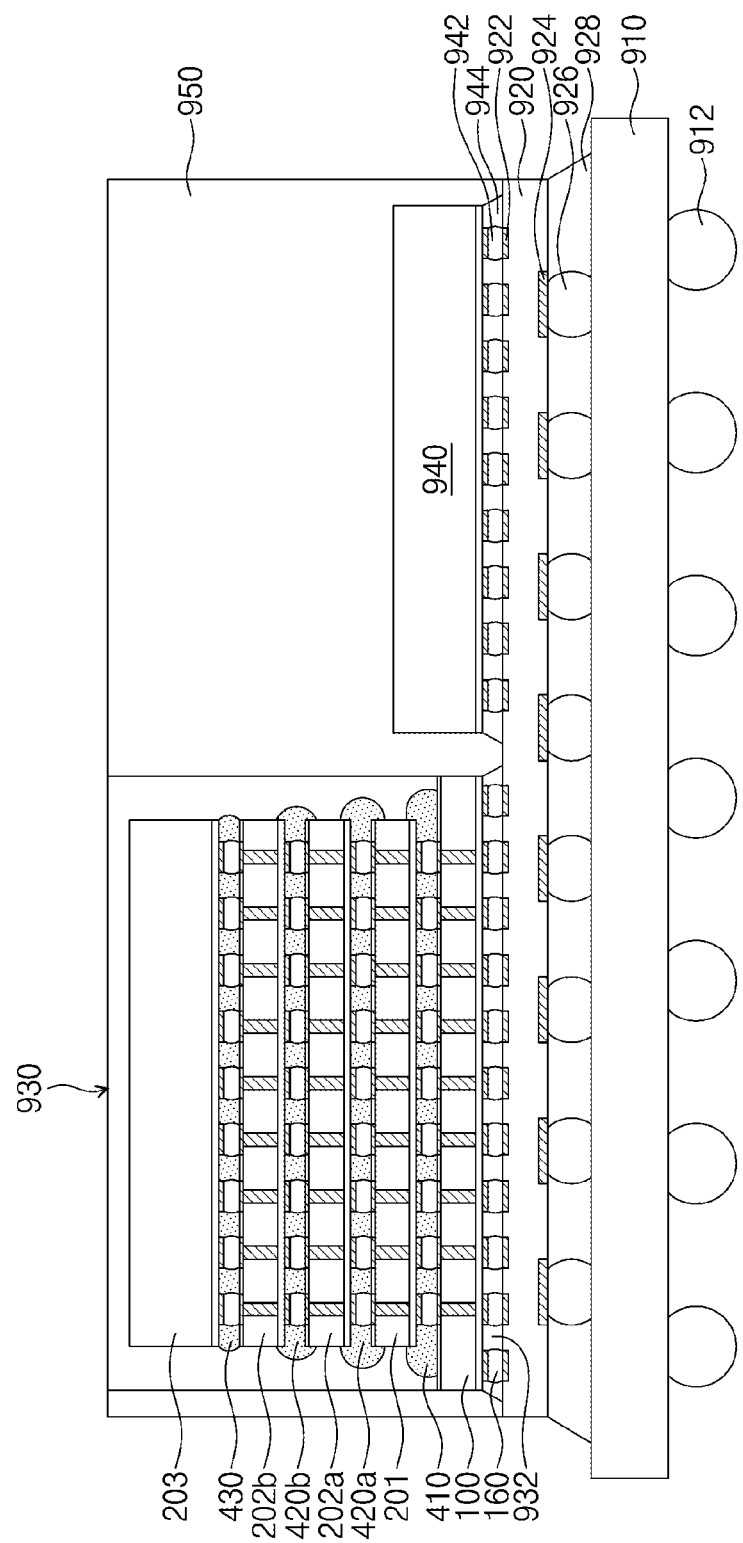
FIG. 8 illustrates a cross-sectional view showing a semiconductor module according to some embodiments of the present inventive concepts.

FIG. 8 illustrates a cross-sectional view showing a semiconductor module according to some embodiments of the present inventive concepts.

Referring to FIG. 8, a semiconductor module may include a module substrate 910, a chip stack package 930 and a graphic processing unit (GPU) 940 that are mounted on the module substrate 910, and an outer molding layer 950 that covers the chip stack package 930 and the graphic processing unit 940. The semiconductor module may further include an interposer 920 provided on the module substrate 910.

The module substrate 910 may be provided. The module substrate 910 may include a printed circuit board (PCB) having a signal pattern on a top surface thereof.

The module substrate 910 may be provided with module terminals 912 thereunder. The module terminals 912 may include solder balls or solder bumps, and based on type of the module terminals 912, the semiconductor module may be provided in the shape of one of a ball grid array (BGA) type, a fine ball-grid array (FBGA) type, and a land grid array (LGA) type.

The interposer 920 may be provided on the module substrate 910. The interposer 920 may include first substrate pads 922 exposed on a top surface of the interposer 920 and second substrate pads 924 exposed on a bottom surface of the interposer 920. The interposer 920 may redistribute the chip stack package 930 and the graphic processing unit 940. The interposer 920 may be flip-chip mounted on the module substrate 910. For example, the interposer 920 may be mounted on the module substrate 910 through substrate terminals 926 provided on the second substrate pads 924. The substrate terminals 926 may include solder balls or solder bumps. A first under-fill layer 928 may be provided between the module substrate 910 and the interposer 920.

The chip stack package 930 may be disposed on the interposer 920. The chip stack package 930 may have a structure the same as or similar to that of the semiconductor package discussed with reference to FIGS. 1 to 7.

The chip stack package 930 may be mounted on the interposer 920. For example, the chip stack package 930 may be coupled through the external terminals 160 of the first semiconductor chip 100 to the first substrate pads 922 of the interposer 920. A second under-fill layer 932 may be provided between the chip stack package 930 and the interposer 920. The second under-fill layer 932 may fill a space between the interposer 920 and the first semiconductor chip 100 and may surround the external terminals 160 of the first semiconductor chip 100.

The graphic processing unit 940 may be disposed on the interposer 920. The graphic processing unit 940 may be disposed spaced apart from the chip stack package 930. The graphic processing unit 940 may have a thickness greater than those of the semiconductor chips 100, 201, 202a, 202b, and 203 of the chip stack package 930. The graphic processing unit 940 may include a logic circuit. For example, the graphic processing unit 940 may be a logic chip. The graphic processing unit 940 may be provided with bumps 942 on a bottom surface thereof. For example, the graphic processing unit 940 may be coupled through the bumps 942 to the first substrate pads 922 of the interposer 920. A third under-fill layer 944 may be provided between the interposer 920 and the graphic processing unit 940. The third under-fill layer 944 may surround the bumps 942 while filling a space between the interposer 920 and the graphic processing unit 940.

The outer molding layer 950 may be provided on the interposer 920. The outer molding layer 950 may cover the top surface of the interposer 920. The outer molding layer 950 may encapsulate the chip stack package 930 and the graphic processing unit 940. The outer molding layer 950 may have a top surface located at the same level as that of a top surface of the chip stack package 930. The outer molding layer 950 may include a dielectric material. For example, the outer molding layer 950 may include an epoxy molding compound (EMC).

FIGS. 9 to 17 illustrate cross-sectional views showing a method of fabricating a semiconductor package according to some embodiments of the present inventive concepts.

Figure 9:
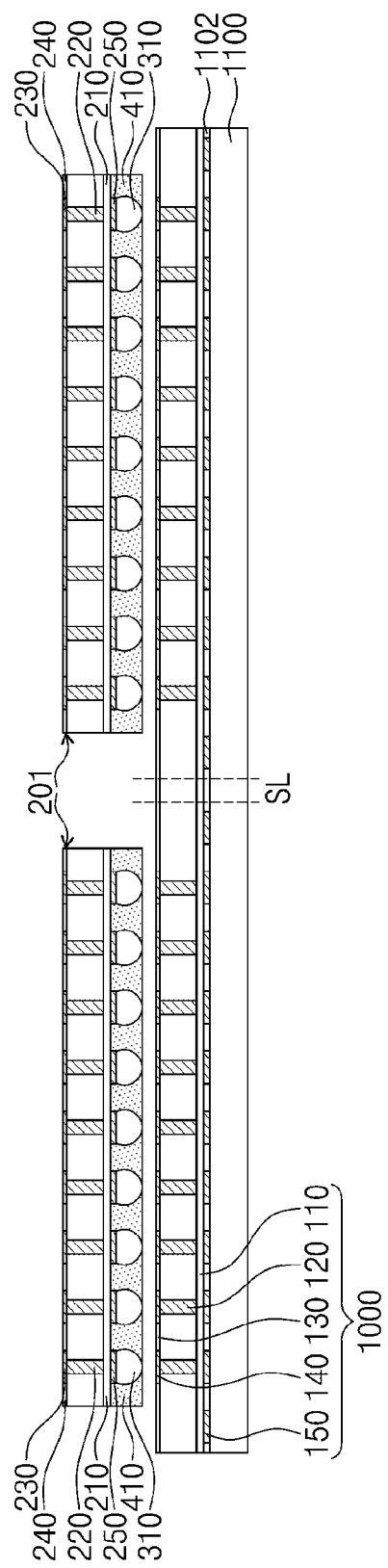
FIGS. 9, 10, 11, 12, 13, 14, 15, 16, 17, 18, 19, and 20 illustrate cross-sectional views showing a method of fabricating a semiconductor package according to some embodiments of the present inventive concepts.

Referring to FIG. 9, a wafer 1000 may be provided. The wafer 1000 may have a top surface and a bottom surface that is opposite to the top surface. For example, the wafer 1000 may be or include a silicon wafer or a semiconductor wafer different from the silicon wafer. For another example, a printed circuit board (PCB) may be provided to replace the wafer 1000. The wafer 1000 may include a first circuit layer 110, a first protection layer 140 that is disposed opposite to the first circuit layer 110, first vias 120 that penetrate a portion of the wafer 1000 in a direction from the first protection layer 140 toward the first circuit layer 110, first upper pads 130 in the first protection layer 140, and first lower pads 150 on the first circuit layer 110.

The wafer 1000 may be provided on a carrier substrate 1100. The carrier substrate 1100 may be a dielectric substrate including glass or polymer or may be a conductive substrate including metal. An adhesive member 1102 may be provided on a top surface of the carrier substrate 1100. For example, the adhesive member 1102 may include a glue tape. The wafer 1000 may be attached to the carrier substrate 1100 to allow the first circuit layer 110 to face the carrier substrate 1100.

A plurality of first lower semiconductor chips 201 may be provided on the wafer 1000. Each of the first lower semiconductor chips 201 may include a second circuit layer 210, a second protection layer 240 that stands opposite to the second circuit layer 210, a second via 220 that penetrates a portion of the first lower semiconductor chip 201 in a direction from the second protection layer 240 toward the second circuit layer 210, a second upper pad 230 in the second protection layer 240, and a second lower pad 250 on the second circuit layer 210. The first lower semiconductor chips 201 may be provided on their bottom surfaces with first lower chip terminals 310 and first lower non-conductive layers 410 that surround the first lower chip terminals 310. For example, the first lower non-conductive layers 410 may include a non-conductive film (NCF) or a non-conductive paste (NCP). When the first lower non-conductive layers 410 are non-conductive adhesives, the first lower non-conductive layers 410 may be formed by a dispensing method in which the first lower semiconductor chips 201 are coated thereon with a liquid non-conductive adhesive. When the first lower non-conductive layers 410 are non-conductive films, the first lower non-conductive layers 410 may be formed by attaching a non-conductive film on the first lower semiconductor chips 201. For example, the first lower non-conductive layers 410 may be provided on the wafer 1000, and the first lower semiconductor chips 201 may be provided on the first lower non-conductive layers 410.

Figure 10:
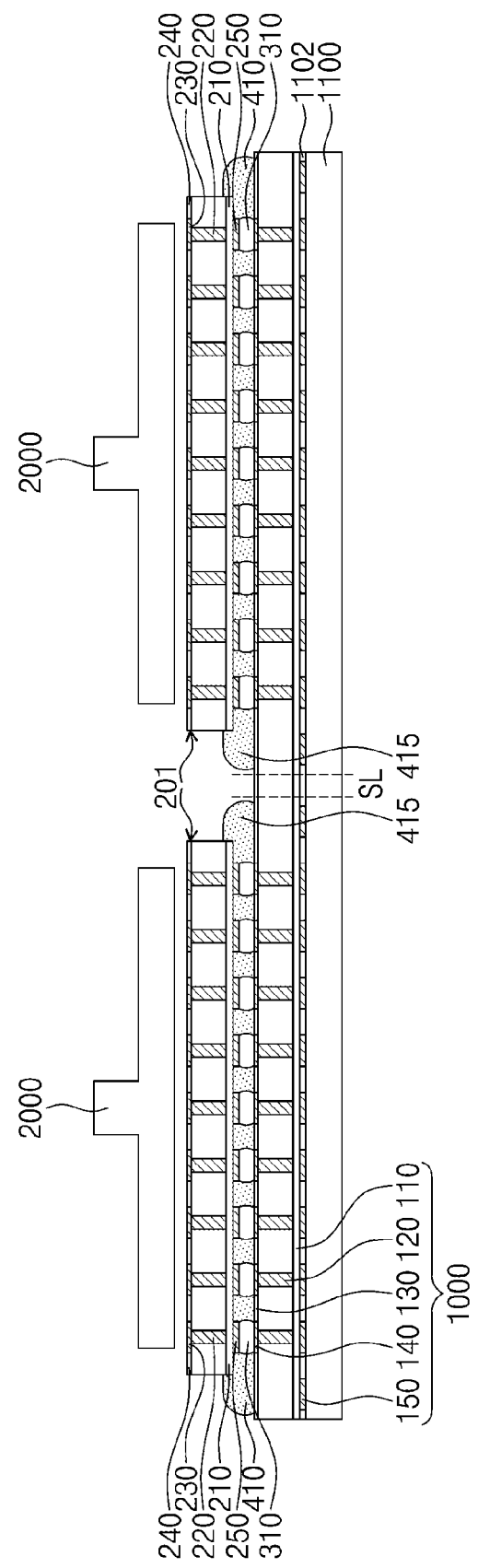

Referring to FIG. 10, a thermocompression bonding may be performed to bond the first lower semiconductor chips 201 to the wafer 1000. The first lower chip terminals 310 may electrically connect the wafer 1000 to the first lower semiconductor chips 201. For example, a bonding tool 2000 used for a bonding process may have a width less than those of the first lower semiconductor chips 201. When the first lower semiconductor chips 201 are compressed toward the wafer 1000, the first lower non-conductive layers 410 may outwardly protrude from lateral or side surfaces of the first lower semiconductor chips 201. The first lower non-conductive layers 410 may have first extensions 415 at their protruding portions. The first extensions 415 may have their portions that extend onto and partially cover the lateral surfaces of the first lower semiconductor chips 201. The first extensions 415 may each have a thickness greater than an interval or spacing between the wafer 1000 and the first lower semiconductor chips 201.

When the thermocompression process continues, the first lower non-conductive layers 410 may be partially cured by heat provided to the first lower semiconductor chips 201.

Figure 11:
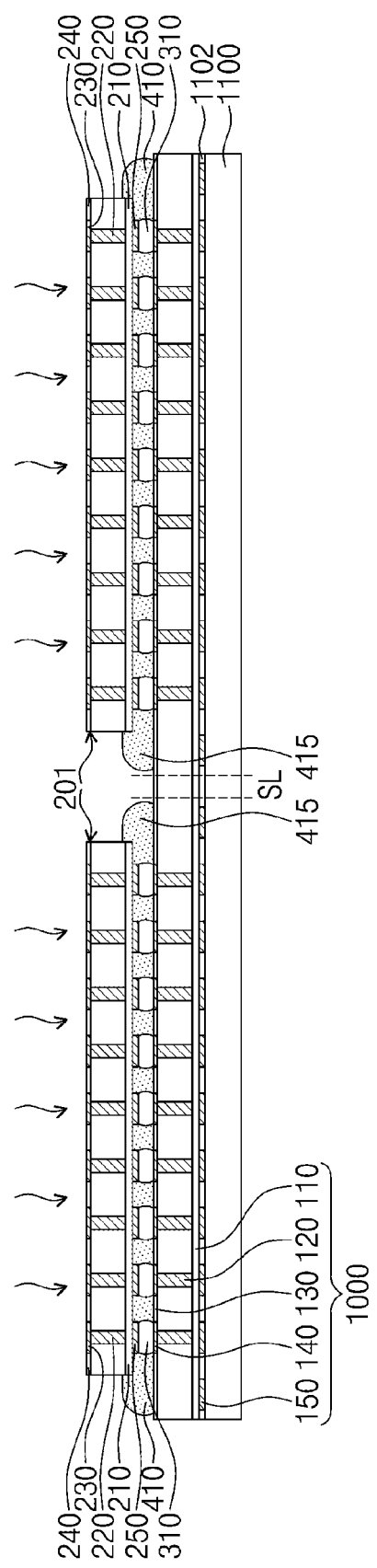

Referring to FIG. 11, a first annealing process may be performed on the first lower semiconductor chips 201. The first annealing process may partially cure the first lower non-conductive layers 410. The first annealing process may increase the degree of curing of the first lower non-conductive layers 410. In this description, the expression "the degree of curing" may mean the degree of curing of an object on which a certain curing process (or a separate process) is performed. For example, the higher degree of curing, the greater rigidity of the object. The first annealing process may continue until the first lower non-conductive layers 410 have their required rigidities. When the first lower non-conductive layers 410 have their sufficient rigidities, no first annealing process may be performed.

Figure 12:
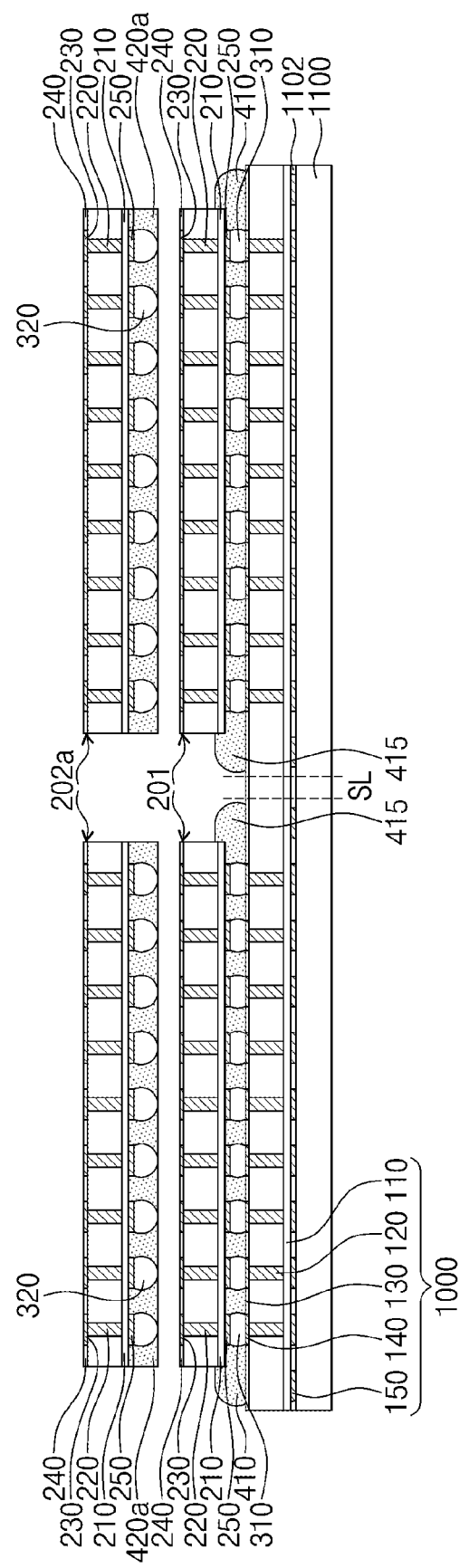

Referring to FIG. 12, a plurality of first intermediate semiconductor chips 202*a* may be provided on the first lower semiconductor chips 201. Each of the first intermediate semiconductor chips 202*a* may include a plurality of second vias 220. The first intermediate semiconductor chips 202*a* may each be provided on its bottom surfaces with first upper chip terminals 320 and a first intermediate non-conductive layer 420*a* that surrounds the first upper chip terminals 320. The first intermediate non-conductive layer 420*a* may include the same material as that of the first lower non-conductive layers 410. For example, the first intermediate non-conductive layer 420*a* may include a non-conductive film (NCF) or a non-conductive paste (NCP). When the first intermediate non-conductive layer 420*a* is a non-conductive adhesive, the first intermediate non-conductive layers 420*a* may be formed by a dispensing method in which the first intermediate semiconductor chips 202*a* are coated thereon with a liquid non-conductive adhesive. When the first intermediate non-conductive layer 420*a* is a non-conductive film, the first lower non-conductive layers 410 may be formed by attaching a non-conductive film on the first intermediate semiconductor chips 202*a*. For example, the first intermediate non-conductive layers 420*a* may be provided on the first lower semiconductor chips 201, and the first intermediate semiconductor chips 202*a* may be provided on the first intermediate non-conductive layers 420*a*.

Figure 13:
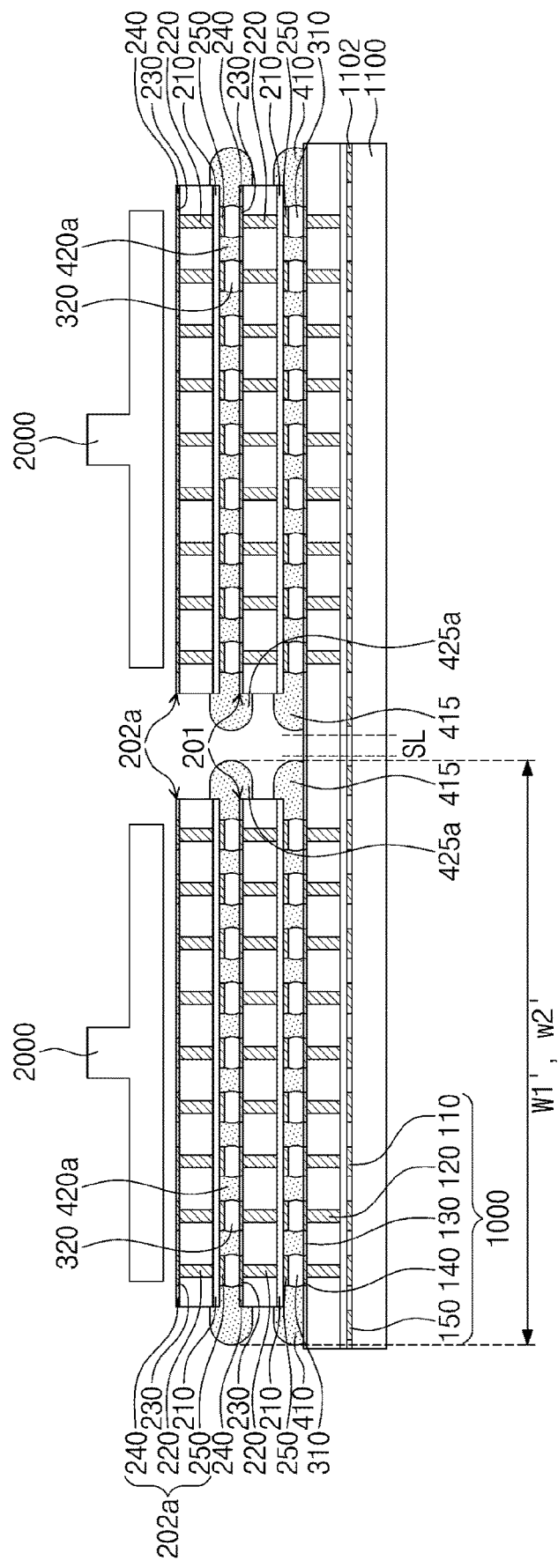

Referring to FIG. 13, a thermocompression bonding may be performed to bond the first intermediate semiconductor chips 202*a* to the first lower semiconductor chips 201. First upper chip terminals 320 may electrically connect the first lower semiconductor chips 201 to the first intermediate semiconductor chips 202*a*. For example, a bonding tool 2000 used for a bonding process may have a width less than those of the first intermediate semiconductor chips 202*a*. In this case, when the first intermediate semiconductor chips 202*a* are compressed toward the first lower semiconductor chips 201, the first intermediate non-conductive layers 420*a* may outwardly protrude from lateral surfaces of the first intermediate semiconductor chips 202*a*. The first intermediate non-conductive layers 420*a* may have second extensions 425*a* at their protruding portions. In this case, the second extensions 425*a* may have their portions that extend onto and partially cover the lateral or side surfaces of the first lower semiconductor chips 201 and/or the lateral or side surfaces of the first intermediate semiconductor chips 202*a*. As the first intermediate semiconductor chips 202*a* are configured substantially identical to the first lower semiconductor chips 201, during a thermocompression process performed on the first intermediate semiconductor chips 202*a* or the first lower semiconductor chips 201, the first extensions 415 and the second extensions 425*a* may have substantially the same or similar protruding lengths. For example, the first intermediate non-conductive layer 420*a* may have a width w2' substantially the same as or similar to a width w1' of the first lower non-conductive layer 410.

As the thermocompression process continues, the first lower non-conductive layers 410 and the first intermediate non-conductive layers 420*a* may be partially cured by heat provided to the first intermediate semiconductor chips 202*a*. The first lower non-conductive layers 410 may be first cured in the thermocompression bonding process for the first lower semiconductor chips 201 and the first annealing process, and then may be additionally cured in the thermocompression bonding process for the first intermediate semiconductor chips 202*a*. Therefore, the first lower non-conductive layers 410 may have their degree of curing greater than that of the first intermediate non-conductive layer 420*a*, and may have their rigidity greater than that of the first intermediate non-conductive layer 420*a*.

Although not shown, a second annealing process may be performed on the first intermediate semiconductor chips 202*a*. The second annealing process may partially cure the first intermediate non-conductive layers 420*a*. The second annealing process may increase the degree of curing of the first intermediate non-conductive layers 420*a*. The second annealing process may continue until the first intermediate non-conductive layers 420*a* have their required rigidities. When the first intermediate non-conductive layers 420*a* have their sufficient rigidities, no second annealing process may be performed.

Figure 14:
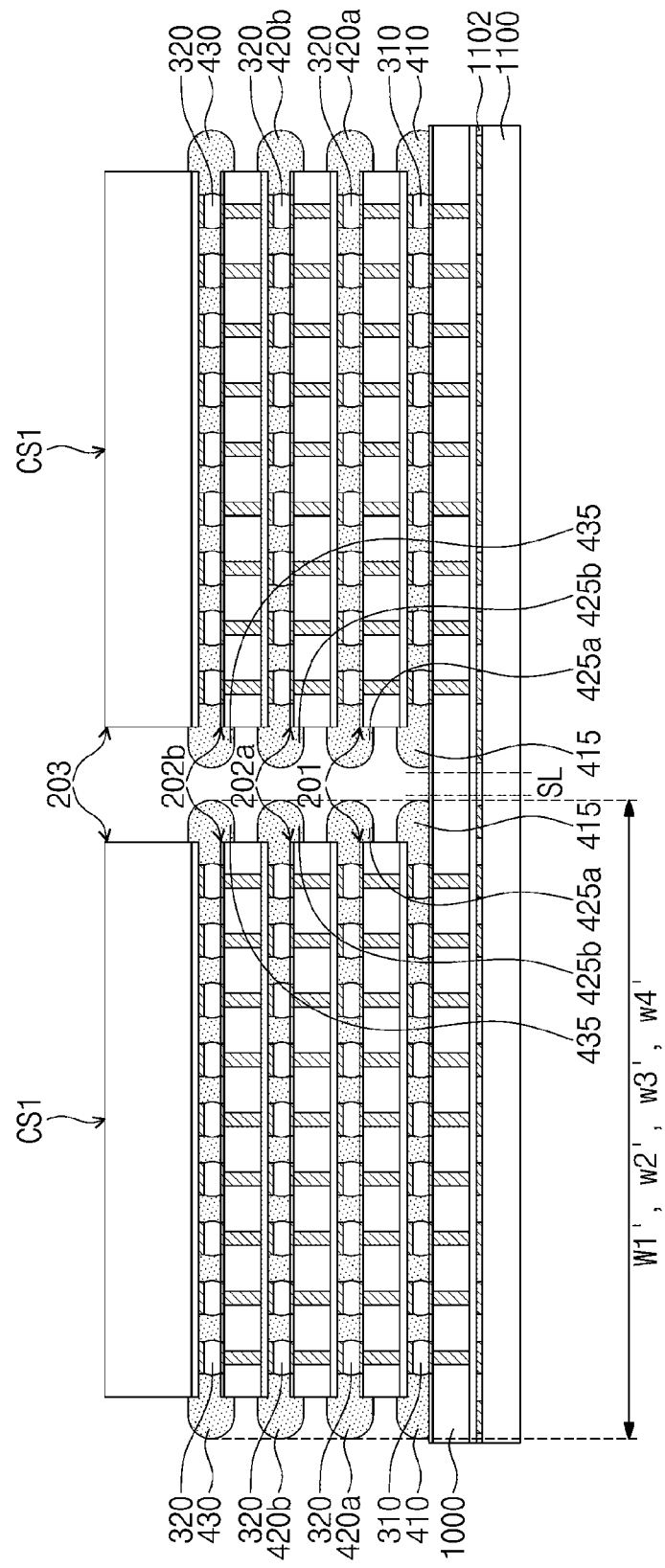

Referring to FIG. 14, the processes discussed in FIGS. 9 to 13 may be repetitively performed such that the first lower semiconductor chips 201, the first intermediate semiconductor chips 202*a* and 202*b*, and the first upper semiconductor chips 203 may be sequentially bonded to the wafer 1000. The first lower semiconductor chip 201, the first intermediate semiconductor chips 202*a* and 202*b*, and the first upper semiconductor chip 203 may constitute a first chip stack CS1. A lowermost first intermediate semiconductor chip 202*a* and an uppermost first intermediate semiconductor chip 202*b* may be provided therebetween with first upper chip terminals 320 and second intermediate non-conductive layers 420*b* that surround the first upper chip terminals 320. The second intermediate non-conductive layers 420*b* may have third extensions 425*b* at their portions that outwardly protrude from lateral surfaces of the uppermost first intermediate semiconductor chips 202*b*. The uppermost first intermediate semiconductor chips 202*b* and the first upper semiconductor chips 203 may be provided therebetween with first upper chip terminals 320 and first upper non-conductive layers 430 that surround the first upper chip terminals 320. The first upper non-conductive layers 430 may have fourth extensions 435 at their portions that outwardly protrude from lateral surfaces of the first upper semiconductor chips 203. The first, second, third, and fourth extensions 415, 425*a*, 425*b*, and 435 may have their protruding lengths that are substantially the same as or similar to each other. For example, a width w1' of the first lower non-conductive layer 410, a width w2' of the first intermediate non-conductive layer 420*a*, a width w3' of the second intermediate non-conductive layer 420*b*, and a width w4' of the first upper non-conductive layer 430 may be substantially the same as or similar to each other.

According to some embodiments of the present inventive concepts, a thermocompression process may be sequentially performed on the first lower semiconductor chips 201, the lowermost first intermediate semiconductor chips 202*a*, the uppermost first intermediate semiconductor chips 202*b*, and the first upper semiconductor chips 203, and a first annealing process may be additionally performed on the first lower non-conductive layer 410. Therefore, the first lower non-conductive layer 410 may have their degree of curing greater than that of the first intermediate non-conductive layer 420*a*, the degree of curing of the first intermediate non-conductive layer 420*a* may be greater than that of the second intermediate non-conductive layer 420*b*, and the degree of curing of the second intermediate non-conductive layer 420*b* may be greater than that of the first upper non-conductive layer 430. The first lower non-conductive layers 410 may have their rigidities greater than that of the first intermediate non-conductive layer 420*a*, the rigidity of the first intermediate non-conductive layer 420*a* may be greater than that of the second intermediate non-conductive layer 420b, and the rigidity of the second intermediate non-conductive layer 420b may be greater than that of the first upper non-conductive layer 430.

Figure 15:
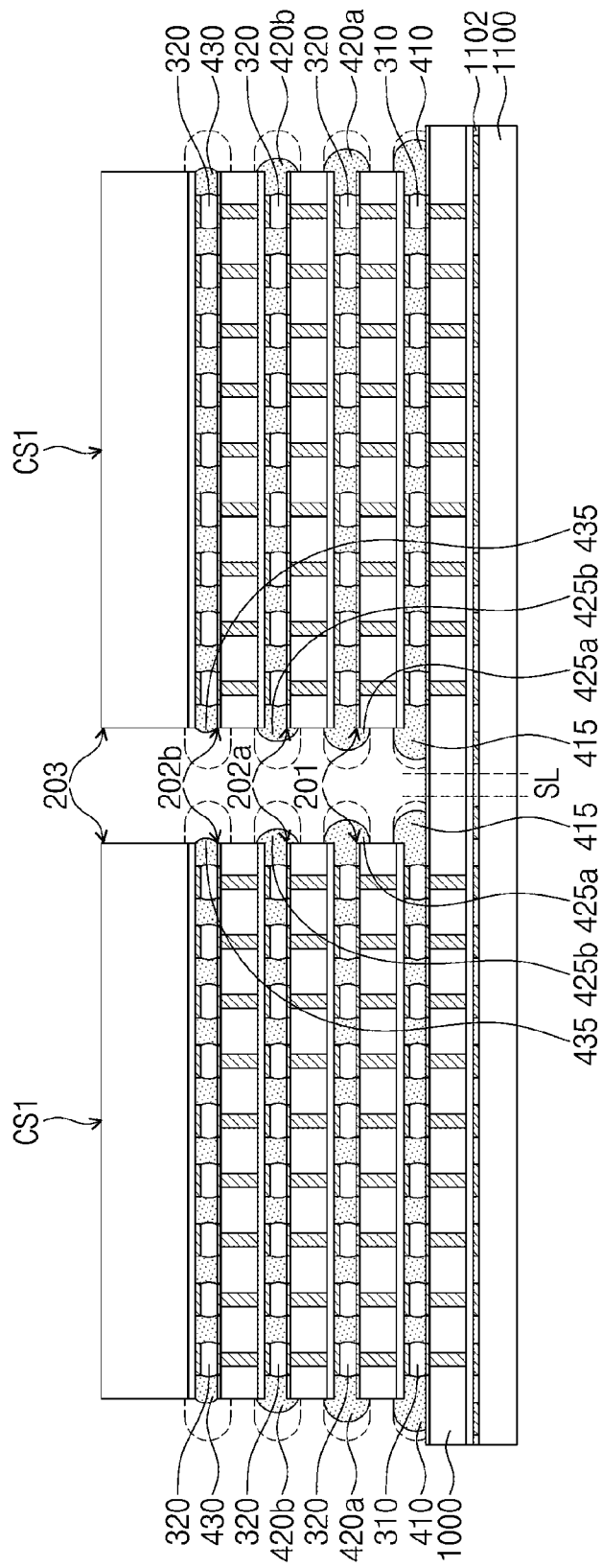

Referring to FIG. 15, a strip process may be performed on the first chip stack CS1. The first non-conductive layers 410, 420a, 420b, and 430 may act as a target for the strip process. For example, a cleaning solution may be provided to the wafer 1000. The cleaning solution may partially remove the first non-conductive layers 410, 420a, 420b, and 430. For example, the cleaning solution may etch the extensions 415, 425a, 425b, and 435. The cleaning solution may include an acid solution. In some embodiments of the present inventive concepts, the cleaning process may include various solutions that are capable of chemically etching only the first non-conductive layers 410, 420a, 420b, and 430 without damaging the wafer 1000, the first lower semiconductor chips 201, the first intermediate semiconductor chips 202a and 202b, or the first upper semiconductor chips 203.

Because the first non-conductive layers 410, 420a, 420b, and 430 have different rigidities from each other, the first non-conductive layers 410, 420a, 420b, and 430 may have their etch rates that are different from each other. In this description, the language "etch rate" may indicate how an object is etched for a time during which the object is exposed to an etchant. The first non-conductive layers 410, 420a, 420b, and 430 may have their etch rates that decrease in a direction toward the wafer 1000. For example, the first lower non-conductive layer 410 may have a first etch rate less than a second etch rate of the first intermediate non-conductive layer 420a, the second etch rate of the first intermediate non-conductive layer 420a may be less than a third etch rate of the second intermediate non-conductive layer 420b, and the third etch rate of the second intermediate non-conductive layer 420b may be less than a fourth etch rate of the first upper non-conductive layer 430. Therefore, in the strip process, the first extension 415 of the first lower non-conductive layer 410 may be etched at the smallest rate, and the fourth extension 435 may be etched at the highest rate. For example, among the extensions 415, 425a, 425b, and 435 that remain after the strip process, the first extension 415 may have the largest width and the fourth extension 435 may have the smallest width. As a result of the strip process, the first extension 415 of the first lower non-conductive layer 410 may have a first protruding length greater than a second protruding length of the second extension 425a included in the first intermediate non-conductive layer 420a, the second protruding length of the second extension 425a included in the first intermediate non-conductive layer 420a may be greater than a third protruding length of the third extension 425b included in the second intermediate non-conductive layer 420b, and the third protruding length of the third extension 425b included in the second intermediate non-conductive layer 420b may be greater than a fourth protruding length of the fourth extension 435 included in the first upper non-conductive layer 430.

According to some embodiments, before the strip process is performed, an ashing process may be executed if necessary. For example, a plasma etching process may be performed on lateral surfaces of the extensions 415, 425a, 425b, and 435. For example, a plasma etching process may remove outer partial portions of the first non-conductive layers 410, 420a, 420b, and 430, which outer partial portions are chemically changed in semiconductor package fabrication. Alternatively, a plasma etching process may remove impurities at outer portions of the first non-conductive layers 410, 420a, 420b, and 430.

Figure 16:
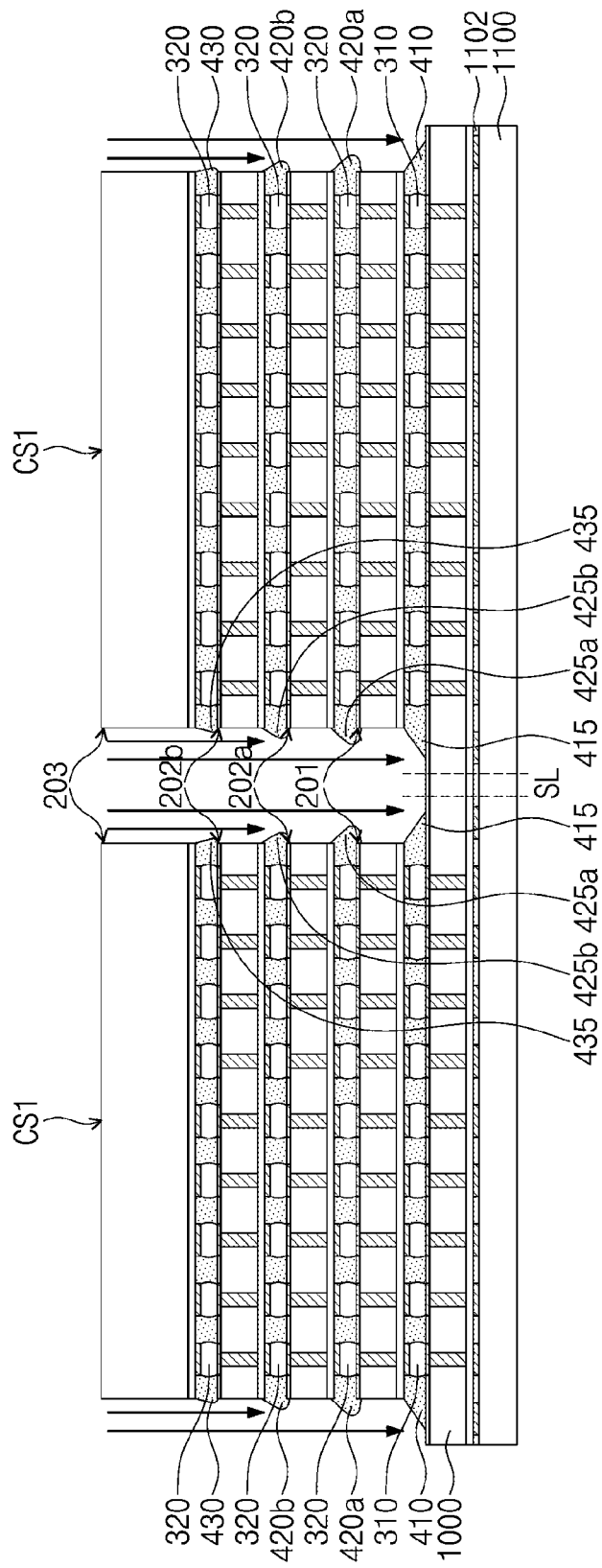

According to some embodiments, an anisotropic etching process may be performed to replace the strip process. As shown in FIG. 16, the first non-conductive layers 410, 420a, 420b, and 430 may act as a target for the anisotropic etching process. During the anisotropic etching process, the first upper non-conductive layer 430 at top position may be etched at the largest rate, and the first lower non-conductive layer 410 at bottom position may be etched at the smallest rate. Therefore, among the extensions 415, 425a, 425b, and 435 that remain after the anisotropic etching process, the first extension 415 may have the largest width and the fourth extension 435 may have the smallest width. In addition, the extensions 415, 425a, 425b, and 435 of the first non-conductive layers 410, 420a, 420b, and 430 may each have a width that increases in a direction top to bottom surfaces thereof. In the embodiment of FIG. 16, a semiconductor package may be fabricated which is discussed with reference to FIG. 5. The following description will focus on the embodiment of FIG. 15.

Figure 17:
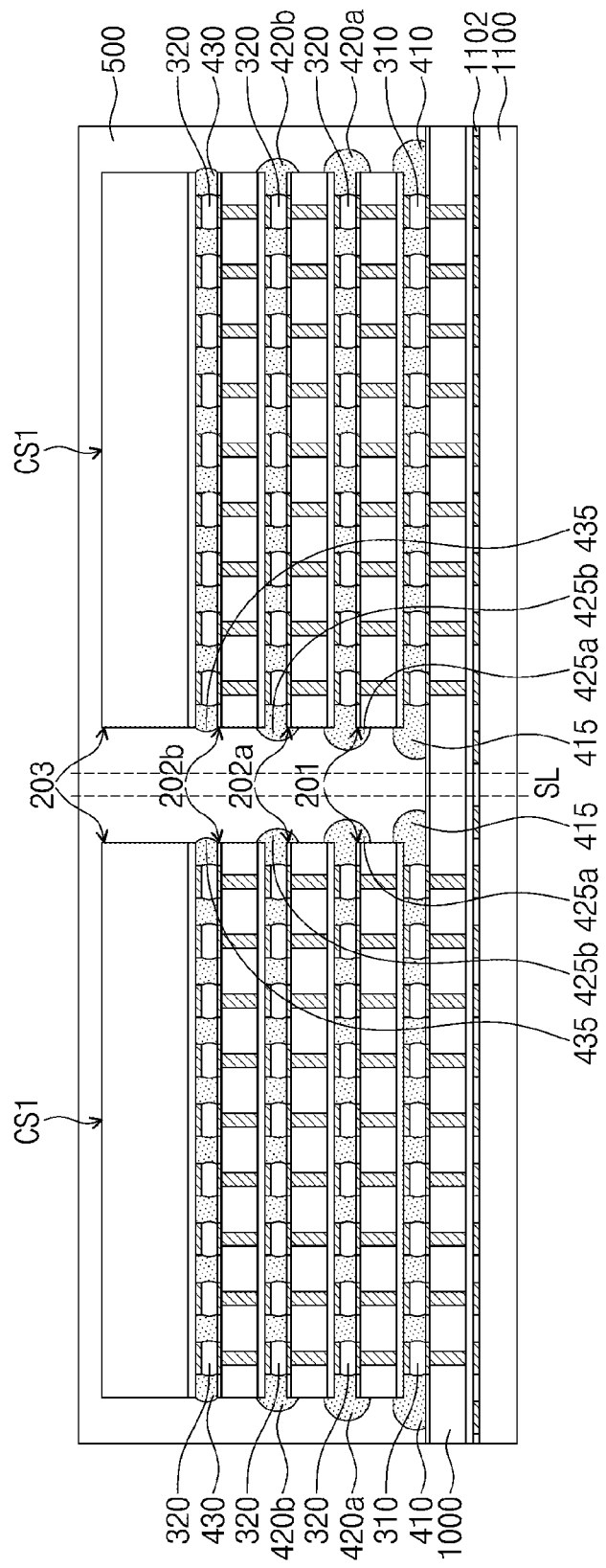

Referring to FIG. 17, a molding layer 500 may be formed on the wafer 1000. The molding layer 500 may cover the first chip stack CS1. The molding layer 500 may encapsulate the first lower semiconductor chips 201, the first intermediate semiconductor chips 202a and 202b, the first upper semiconductor chips 203, and the first non-conductive layers 410, 420a, 420b, and 430. For example, a dielectric member may be coated on the wafer 1000 so as to cover the first chip stack CS1, and then the dielectric member may be cured to form the molding layer 500. After the formation of the molding layer 500, a planarization process may be performed as needed to expose a top surface of the first upper semiconductor chip 203.

Thereafter, the molding layer 500 and the wafer 1000 may undergo a singulation process to form semiconductor packages separated from each other. For example, a sawing process may be executed along a sawing line SL. The sawing process may be fulfilled such that the molding layer 500 and the wafer 1000 may be cut between the first chip stacks CS1.

According to some embodiments of the present inventive concepts, a strip process may be performed to reduce widths of the first non-conductive layers 410, 420a, 420b, and 430, and distal ends of the first non-conductive layers 410, 420a, 420b, and 430 may be more remote from the sawing line SL. Therefore, the first non-conductive layers 410, 420a, 420b, and 430 may be free of damage due to a sawing blade or a laser in the sawing process, and in the sawing process, there may be a reduction in impact and/or stress applied to the first non-conductive layers 410, 420a, 420b, and 430. For example, a semiconductor package may be prevented from damage caused by impact and/or stress in the sawing process, and a semiconductor package fabrication method may be provided with reduced occurrence of failure.

External terminals 160 may be provided on a bottom surface of the first semiconductor chip 100 in each semiconductor package.

Figure 18:
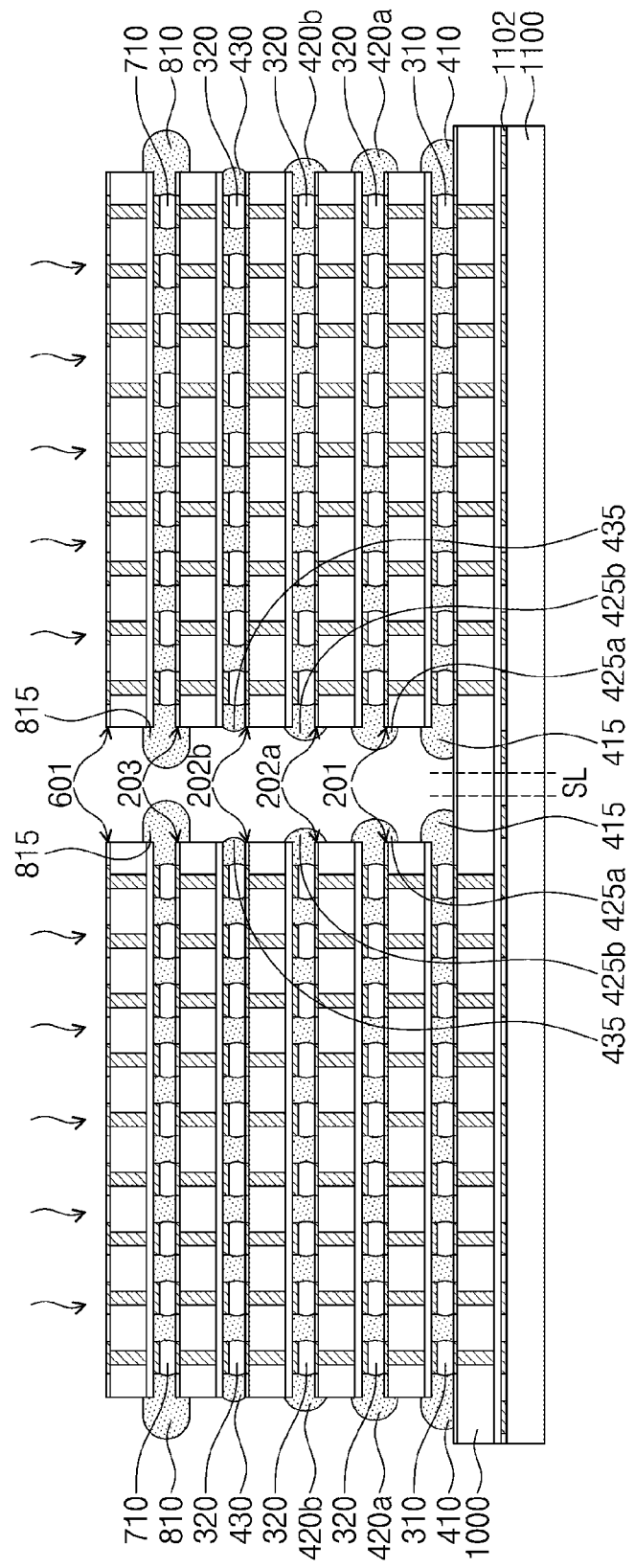
Figure 19:
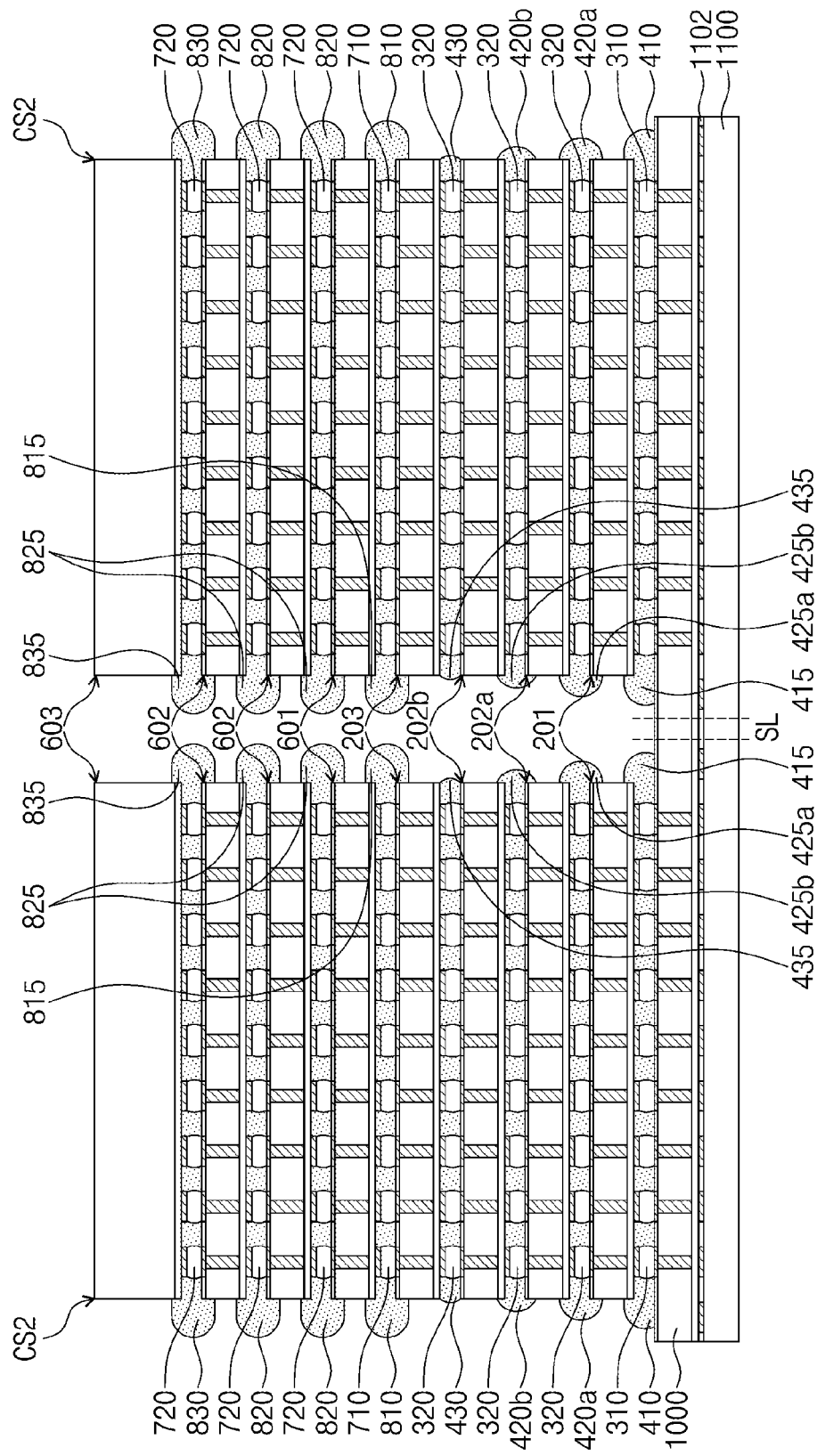
Figure 20:
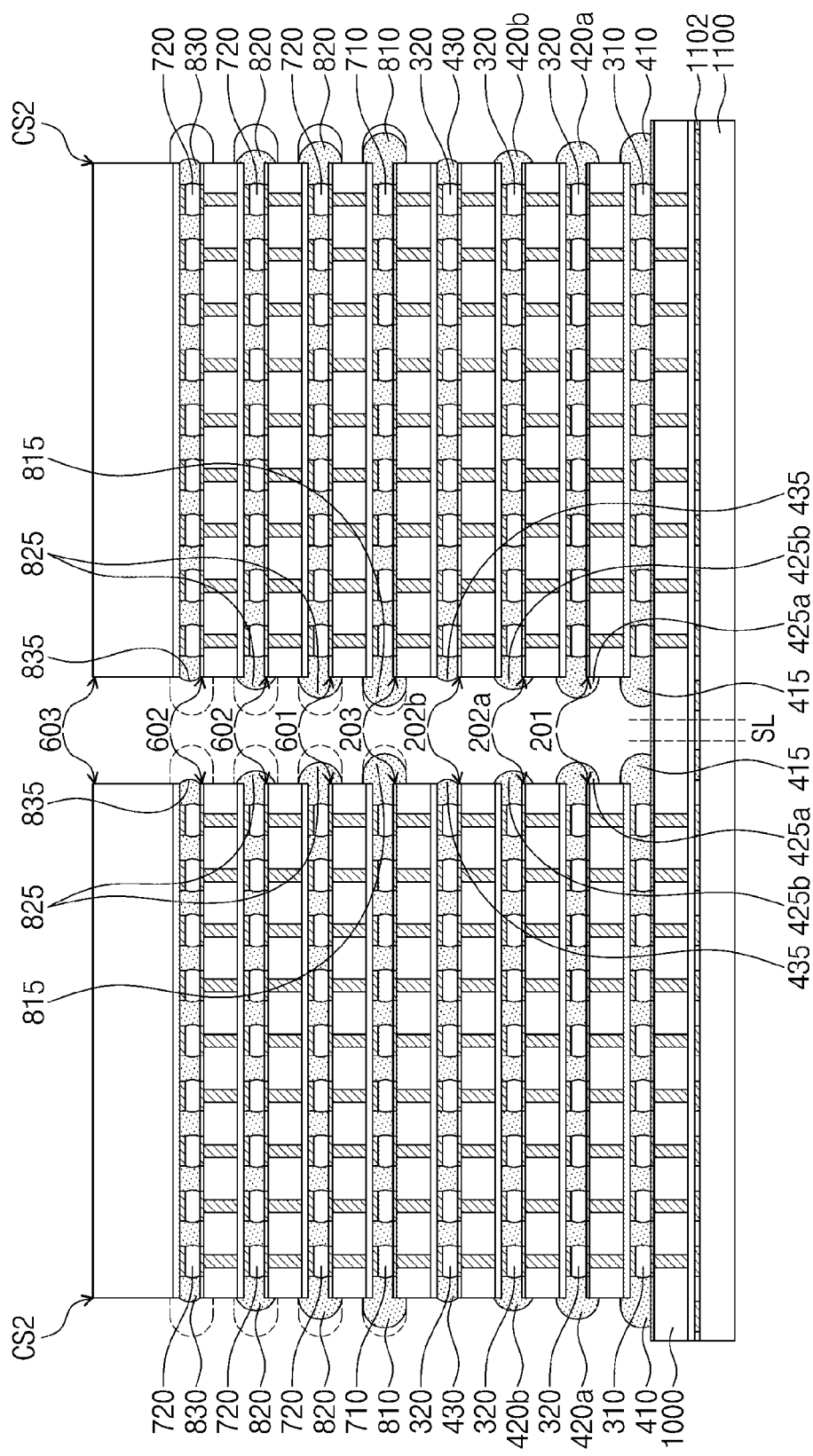

FIGS. 18 to 20 illustrate cross-sectional views showing a method of fabricating a semiconductor package according to some embodiments of the present inventive concepts.

Referring to FIG. 18, second lower semiconductor chips 601 may be provided on a resultant structure of FIG. 15. The second lower semiconductor chips 601 may be mounted on corresponding first upper semiconductor chips 203. The mounting of the second lower semiconductor chips 601 may be similar to the mounting of the first lower semiconductor chips 201.

A plurality of second lower semiconductor chips 601 may be provided on the first upper semiconductor chips 203. The second lower semiconductor chips 601 may be provided on their bottom surfaces with second lower chip terminals 710 and second lower non-conductive layers 810 that surround the second lower chip terminals 710.

A thermocompression bonding may be performed to bond the second lower semiconductor chips 601 to the first upper semiconductor chips 203. When the second lower semiconductor chips 601 are compressed toward the wafer 1000, the second lower non-conductive layers 810 may outwardly protrude from lateral surfaces of the second lower semiconductor chips 601. The second lower non-conductive layers 810 may have fifth extensions 815 at their protruding portions.

When the thermocompression process continues, the second lower non-conductive layers 810 may be partially cured by heat provided to the second lower semiconductor chips 601.

A second annealing process may be performed on the second lower semiconductor chips 601. The second annealing process may partially cure the second lower non-conductive layers 810. The second annealing process may increase the degree of curing of the second lower non-conductive layers 810.

Referring to FIG. 19, the processes discussed in FIG. 18 may be repetitively performed such that the second lower semiconductor chips 601, the second intermediate semiconductor chips 602, and the second upper semiconductor chips 603 may be sequentially bonded to the first upper semiconductor chips 203. The second lower semiconductor chip 601, the second intermediate semiconductor chips 602, and the second upper semiconductor chip 603 may constitute a second chip stack CS2. Second upper chip terminals 720 and third intermediate non-conductive layers 820 that surround the second upper chip terminals 720 may be formed between the second lower semiconductor chip 601 and the second intermediate semiconductor chip 602 and between the second intermediate semiconductor chips 602. The third intermediate non-conductive layers 820 may have sixth extensions 825 at their portions that outwardly protrude from lateral surfaces of the second intermediate semiconductor chips 602. Second upper chip terminals 720 and second upper non-conductive layers 830 that surround the second upper chip terminals 720 may be formed between the second intermediate semiconductor chips 602 and the second upper semiconductor chips 603. The second upper non-conductive layers 830 may have seventh extensions 835 at their portions that outwardly protrude from lateral surfaces of the second upper semiconductor chips 603. The fifth, sixth, and seventh extensions 815, 825, and 835 may have their protruding lengths that are substantially the same as or similar to each other. For example, the second lower non-conductive layers 810, the third intermediate non-conductive layers 820, and the second upper non-conductive layers 830 may have widths that are substantially the same as or similar to each other.

A thermocompression process may be sequentially performed on the second lower semiconductor chips 601, the second intermediate semiconductor chips 602, and the second upper semiconductor chips 603, and a second annealing process may be additionally performed on the second lower non-conductive layers 810. Therefore, the second lower non-conductive layers 810 may have their degree of curing greater than that of the third intermediate non-conductive layer 820, and the degree of curing of the third intermediate non-conductive layer 820 may be greater than that of the second upper non-conductive layer 830. The second lower non-conductive layers 810 may have rigidities greater than that of the third intermediate non-conductive layer 820, and the rigidity of the third intermediate non-conductive layer 820 may be greater than that of the second upper non-conductive layer 830.

Referring to FIG. 20, a strip process may be performed on the second chip stack CS2. The second non-conductive layers 810, 820, and 830 may act as a target for the strip process. For example, a cleaning solution may be provided to the wafer 1000. The cleaning solution may partially remove the second non-conductive layers 810, 820, and 830. For example, the cleaning solution may etch the extensions 815, 825, and 835.

Because the second non-conductive layers 810, 820, and 830 have different rigidities from each other, the second non-conductive layers 810, 820, and 830 may have etch rates that are different from each other. In this description, the language "etch rate" may indicate how an object is etched for a time during which the object is exposed to an etchant. The second non-conductive layers 810, 820, and 830 may have their etch rates that decrease in a direction toward the first upper semiconductor chip 203. For example, the etch rate of the second lower non-conductive layer 810 may be less than that of the third intermediate non-conductive layer 820, and the etch rate of the third intermediate non-conductive layer 820 may be less than that of the second upper non-conductive layer 830. Therefore, among the extensions 815, 825, and 835 that remain after the strip process, the fifth extension 815 may have the largest width and the seventh extension 835 may have the smallest width.

Afterwards, as shown in FIG. 7, a molding layer 500 may be formed on the wafer 1000. The molding layer 500 may cover the first chip stack CS1 and the second chip stack CS2. For example, a dielectric member may be coated on the wafer 1000 so as to cover the first chip stack CS1 and the second chip stack CS2, and then the dielectric member may be cured to form the molding layer 500. After the formation of the molding layer 500, a planarization process may be performed as needed to expose a top surface of the second upper semiconductor chip 603.

The molding layer 500 and the wafer 1000 may undergo a singulation process to form semiconductor packages separated from each other. For example, a sawing process may be executed along a sawing line SL. The sawing process may be fulfilled such that the molding layer 500 and the wafer 1000 may be cut between the first chip stacks CS1 and between the second chip stacks CS2.

According to some embodiments of the present inventive concepts, a strip process may be performed to reduce widths of the first non-conductive layers 410, 420a, 420b, and 430 and widths of the second non-conductive layers 810, 820, and 830, and distal ends of the first non-conductive layers 410, 420a, 420b, and 430 and distal ends of the second non-conductive layers 810, 820, and 830 may be more remote from the sawing line SL. Therefore, the first non-conductive layers 410, 420a, 420b, and 430 and the second non-conductive layers 810, 820, and 830 may be free of damage due to a sawing blade or a laser in the sawing process, and in the sawing process, there may be a reduction in impact and/or stress applied to the first non-conductive layers 410, 420a, 420b, and 430 and the second non-conductive layers 810, 820, and 830. For example, a semiconductor package may be prevented from damage caused by impact and/or stress in the sawing process, and a semiconductor package fabrication method may be provided with reduced occurrence of failure.

External terminals 160 may be provided on a bottom surface of the first semiconductor chip 100 in each semiconductor package.

A semiconductor package according to some embodiments of the present inventive concepts may be configured such that a downside or lowermost non-conductive layer may be attached to and supported on a wide top surface of a first semiconductor chip, and thus the semiconductor package may not be suppressed from warpage caused by the downside non-conductive layer. In addition, intermediate non-conductive layers and an upper non-conductive layer may be disposed spaced apart from the first semiconductor chip and may be provided to have their widths less than that of the downside non-conductive layer, and therefore there may be a reduction in warpage resulting from the intermediate non-conductive layers and the upper non-conductive layer. For example, it may be possible to minimize warpage led by the non-conductive layers, to protect chip terminals against stress due to warpage, and to prevent delamination of semiconductor chips. In addition, a load imposed on a lower non-conductive layer may be significantly heavier than that imposed on upper non-conductive layers, and the lower non-conductive layer may have rigidity (or hardness) greater than those of the upper non-conductive layers, with the result that a chip stack may be firmly supported on a base semiconductor chip. As a result, a semiconductor package may be provided to have increased structural stability.

In a method of fabricating a semiconductor package according to some embodiments of the present inventive concepts, widths of the non-conductive layers may be reduced in a strip process and the non-conductive layers may be prevented from damage from a sawing blade or a laser in a sawing process. Accordingly, the semiconductor package may be prevented from damage caused by impact and/or stress in the sawing process, and the semiconductor package fabrication method may be provided with reduced occurrence of failure.

Although the present inventive concepts have been described in connection with some embodiments of the present inventive concepts illustrated in the accompanying drawings, it will be understood by one of ordinary skill in the art that variations in form and detail may be made therein without departing from the essential features of the present inventive concepts. The above disclosed embodiments should thus be considered illustrative and not restrictive.

What is claimed is:

1. A semiconductor package, comprising:
   a substrate that includes a plurality of vias;
   a first chip stack on the substrate, the first chip stack including a plurality of first semiconductor chips that are sequentially stacked on the substrate; and
   a plurality of first non-conductive layers between the substrate and the first chip stack and between neighboring first semiconductor chips,
   wherein each of the first non-conductive layers comprises first extensions that protrude outwardly from first lateral surfaces of the first semiconductor chips,
   wherein the more remote the first non-conductive layers are from the substrate, the first extensions protrude a shorter length from the first lateral surfaces of the first semiconductor chips,
   wherein the first extension of the first non-conductive layer between the substrate and the lowermost one of the first semiconductor chips is on the first lateral surface of the lowermost one of the first semiconductor chips,
   wherein the first extension of the first non-conductive layer between the two lowermost ones of the first semiconductor chips is on the first lateral surfaces of each of the two lowermost ones of the first semiconductor chips, and
   wherein the first extension of the first non-conductive layer between the substrate and the lowermost one of the first semiconductor chips and the first extension of the first non-conductive layer between the two lowermost ones of the first semiconductor chips are vertically spaced apart from each other without being in contact with each other.

2. The semiconductor package of claim 1, wherein the plurality of first non-conductive layers include:
   a first lower non-conductive layer between the substrate and the first chip stack; and
   a plurality of first intermediate non-conductive layers between neighboring ones of the first semiconductor chips,
   wherein a first width of the first lower non-conductive layer is greater than a second width of each of the first intermediate non-conductive layers.

3. The semiconductor package of claim 2, wherein
   the first non-conductive layers each include the same material, and
   a first rigidity of the first lower non-conductive layer is greater than a second rigidity of each of the first intermediate non-conductive layers.

4. The semiconductor package of claim 2, wherein a width of one of the first intermediate non-conductive layers is greater than a width of another of the first intermediate non-conductive layers that is more remote from the substrate.

5. The semiconductor package of claim 1, wherein thicknesses of the first non-conductive layers decrease in a direction from the first chip stack toward the substrate.

6. The semiconductor package of claim 1, wherein
   widths of the first semiconductor chips are substantially the same, and
   the first lateral surfaces of the first semiconductor chips are on an imaginary plane perpendicular to a top surface of the substrate.

7. The semiconductor package of claim 1, wherein the first extensions of the first non-conductive layers are vertically spaced apart from each other.

8. The semiconductor package of claim 1, further comprising:
   a second chip stack on the first chip stack, the second chip stack including a plurality of second semiconductor chips that are sequentially stacked on the first chip stack; and
   a plurality of second non-conductive layers between the first chip stack and the second chip stack and between neighboring second semiconductor chips,
   wherein each of the second non-conductive layers comprises second extensions that protrude outwardly from second lateral surfaces of the second semiconductor chips, and
   wherein the more remote the second non-conductive layers are from the substrate, the second extensions protrude a shorter length from the second lateral surfaces of the second semiconductor chips.

9. The semiconductor package of claim 8, wherein the second non-conductive layers include:
   a second lower non-conductive layer between the first chip stack and the second chip stack; and a plurality of second intermediate non-conductive layers between neighboring ones of the second semiconductor chips, wherein a third width of the second lower non-conductive layer is greater than a width of each of the second intermediate non-conductive layers.

10. The semiconductor package of claim 9, wherein a third rigidity of the second lower non-conductive layer is greater than a rigidity of each of the second intermediate non-conductive layers.

11. The semiconductor package of claim 1, wherein
the substrate is a silicon wafer, and
each of the first semiconductor chips is a memory chip.

12. The semiconductor package of claim 1, further comprising a molding layer on the substrate, the molding layer covering the first semiconductor chips, wherein the first extensions of the first non-conductive layers are spaced apart from an outer lateral surface of the molding layer, wherein a distance between the outer lateral surface of the molding layer and distal ends of the first extensions is in a range of about 100 µm to about 500 µm.

13. A semiconductor package, comprising:
a substrate that includes a plurality of vias;
a first semiconductor chip mounted on a first chip terminal on the substrate;
a first non-conductive layer that fills a space between the substrate and the first semiconductor chip;
a second semiconductor chip mounted on a second chip terminal on a top surface of the first semiconductor chip;
a second non-conductive layer that fills a space between the first semiconductor chip and the second semiconductor chip;
a third semiconductor chip mounted on a third chip terminal on a top surface of the second semiconductor chip;
a third non-conductive layer that fills a space between the second semiconductor chip and the third semiconductor chip; and
a molding layer on the substrate, the molding layer surrounding the first semiconductor chip, the second semiconductor chip, and the third semiconductor chip, wherein a first width of the first non-conductive layer between the substrate and the first semiconductor chip is greater than a second width of the second non-conductive layer between the first semiconductor chip and the second semiconductor chip, wherein the first non-conductive layer and the second non-conductive layer include the same material, wherein a first rigidity of the first non-conductive layer is greater than a second rigidity of the second non-conductive layer, wherein the first non-conductive layer comprises a first extension that protrudes outwardly from and is on a first side surface of the first semiconductor chip, wherein the second non-conductive layer comprises a second extension that protrudes outwardly from a second side surface of the second semiconductor chip and is on the first side surface of the first semiconductor chip and the second side surface of the second semiconductor chip, wherein the first and second extensions are vertically spaced apart from each other without being in contact with each other, and wherein a first thickness of the first non-conductive layer between the substrate and the first semiconductor chip is smaller than a second thickness of the second non-conductive layer between the first semiconductor chip and the second semiconductor chip.

14. The semiconductor package of claim 13, wherein a first length that the first extension protrudes from the first side surface of the first semiconductor chip is greater than a second length that the second extension protrudes from the second side surface of the second semiconductor chip.

15. A semiconductor package, comprising:
a substrate that includes a plurality of vias;
a first semiconductor chip on a first chip terminal on the substrate;
a first non-conductive layer in a space between the substrate and the first semiconductor chip;
a second semiconductor chip on a second chip terminal on a top surface of the first semiconductor chip;
a second non-conductive layer in a space between the first semiconductor chip and the second semiconductor chip;
a third semiconductor chip on a third chip terminal on a top surface of the second semiconductor chip; and
a third non-conductive layer in a space between the second semiconductor chip and the third semiconductor chip, wherein a first width of the first non-conductive layer between the substrate and the first semiconductor chip is greater than a second width of the second non-conductive layer between the first semiconductor chip and the second semiconductor chip, wherein the first non-conductive layer comprises a first extension that protrudes outwardly from and is on a first side surface of the first semiconductor chip, wherein the second non-conductive layer comprises a second extension that protrudes outwardly from a second side surface of the second semiconductor chip and is on the first side surface of the first semiconductor chip and the second side surface of the second semiconductor chip, wherein the first and second extensions are vertically spaced apart from each other without being in contact with each other, and wherein a first thickness of the first non-conductive layer between the substrate and the first semiconductor chip is smaller than a second thickness of the second non-conductive layer between the first semiconductor chip and the second semiconductor chip.

16. The semiconductor package of claim 15, wherein the second width of the second non-conductive layer between the first semiconductor chip and the second semiconductor chip is greater than a third width of the third non-conductive layer between the second semiconductor chip and the third semiconductor chip.

17. The semiconductor package of claim 15, wherein a first rigidity of the first non-conductive layer is greater than a second rigidity of the second non-conductive layer and a third rigidity of the third non-conductive layer.

18. The semiconductor package of claim 17, wherein the first non-conductive layer, the second non-conductive layer, and the third non-conductive layer include the same material.

19. The semiconductor package of claim 15, wherein the second thickness of the second non-conductive layer between the first semiconductor chip and the second semiconductor chip is smaller than a third thickness of the third non-conductive layer between the second semiconductor chip and the third semiconductor chip.

* * * * *